United States Patent
Sharma et al.

(10) Patent No.: US 6,766,317 B2
(45) Date of Patent: Jul. 20, 2004

(54) RANGE CHECK CELL AND A METHOD FOR THE USE THEREOF

(75) Inventors: Mohit Sharma, Bangalore (IN); Damodar Reddy Thummalapally, Milpitas, CA (US); Tavare Dhanaraj B., Maharashta (IN)

(73) Assignee: Alliance Semiconductor, Santa Clara, CA (US)

( * ) Notice: Subject to any disclaimer, the term of this patent is extended or adjusted under 35 U.S.C. 154(b) by 312 days.

(21) Appl. No.: 09/908,987

(22) Filed: Jul. 18, 2001

(65) Prior Publication Data

US 2003/0097605 A1 May 22, 2003

(51) Int. Cl.[7] .................. G06F 17/30; G11C 15/00; G11C 16/06
(52) U.S. Cl. .............. 707/3; 707/2; 707/4; 707/5; 365/49; 365/185.25
(58) Field of Search ............... 365/49, 185.25; 707/3, 1, 10, 100, 103 R, 2, 4, 5

(56) References Cited

U.S. PATENT DOCUMENTS

| | | | |
|---|---|---|---|
| 3,648,254 A | | 3/1972 | Beausoleil |
| 4,145,737 A | | 3/1979 | Lamb et al. |
| 4,622,653 A | | 11/1986 | McElroy |
| 4,747,072 A | | 5/1988 | Robinson et al. |
| 4,794,559 A | | 12/1988 | Greenberger |
| 4,958,377 A | | 9/1990 | Takahashi |
| 4,989,180 A | | 1/1991 | Lipovski |
| 6,081,441 A | * | 6/2000 | Ikeda ..................... 365/49 |
| 6,181,592 B1 | * | 1/2001 | Aoki ..................... 365/49 |

FOREIGN PATENT DOCUMENTS

| | | |
|---|---|---|
| JP | 62-293596 | 12/1987 |
| JP | 09-180468 | 7/1997 |
| JP | 09-180469 | 7/1997 |

OTHER PUBLICATIONS

K.J. Schultz et al.,entitled "Architectures for large–capacity CAMs", Integration, the VLSI Journal 18 (1995) pp. 151–171.

I.N. Robinson, entitled "Pattern–Addressable Memory", Jun. 1992, IEEE Micro, pp. 20–30.

G.J. Lipovski, entitled "A Four Megabit Dynamic Systolic Associative Memory Chip", Journal of VLSI Signal Processing, 4,(1992) pp. 37–51.

M. Motomura et al., entitled "A 1.2–Million Transistor, 33–MHZ, 20–b Dictionary Search Processor (DISP) ULSI with a 160–kb CAM", IEEE Journal of Solid–State Circuits, vol. 25, No. 5, Oct. 1990, pp. 1158–1165.

* cited by examiner

Primary Examiner—Frantz Coby
(74) Attorney, Agent, or Firm—Thelen Reid & Priest LLP

(57) ABSTRACT

A range check array structure for searching and comparing external data from an external search data key is disclosed. The structure has data storage means with at least one of an upper limit field, and a lower limit field, and one or more bit lines running therethrough for transmitting an input data word for comparison with the stored data word range. The input data word being compared with a respective stored data word to detect a match that is indicated along a match line by the check array structure. The check array structure further includes a range match detection means connected to the match line to determine the match or mismatch of the applied data stream with the stored data in each range check cell.

69 Claims, 13 Drawing Sheets

RANGE CHECK CELL AND A METHOD FOR THE USE THEREOF

FIELD OF THE INVENTION

The present invention relates to a range check cell and a method for the use thereof in determining the range match of incoming data values in a database. The invention particularly relates to a range check cell which stores the Upper Limit and Lower Limit of a specified range and facilitates a range match on an incoming data value within one content addressable memory (CAM) operation.

The present invention relates to intelligent range check cells for use in coprocessors using the classless Inter domain routing protocol, which is a subset of the Internet protocol. More particularly, the present invention relates to intelligent range check cells, which can be used as building blocks for a database management system to enable matching of input data to a user determined range of stored data in the system. The present invention also relates to a method for retrieving data, from a plural range of stored data, which matches or is similar to input retrieval data.

BACKGROUND OF THE INVENTION

In the field of information technology, the ability to store, obtain, process, retrieve and transfer data speedily and accurately is critical. Data can include voice, images, pictures, words or any combination thereof.

The necessity for faster and accurate transfer and retrieval of data has increased with the use of the Internet data communication. Data communication over the Internet is performed in accordance with a specific protocol. Each protocol specifies how the data is sent from the source point to the destination point.

The IP protocol governs the data and voice communication over the Internet. The CIDR protocol, which is a subset of the IP protocol, governs addressing over the Internet. Under the CIDR protocol, the correct destination address is the one that is associated with the longest prefix. Each Internet address in the CIDR protocol is associated with an IP address and a sub-net mask value. In each router, the routing tables are constructed out of prefix information and are searched using the destination address to determine the exit port of the router. According to the CIDR protocol, a sub-net mask value could only include a series of consecutive "1s" followed by "0s." "1" represents that the corresponding bit in the associated IP address is used to determine the final physical address of the destination.

A transfer of information between two points begins by the user sending a packet of information to the receiver. Depending upon the location of the receiver, the information may have to travel through several networks before it reaches the receiver. It therefore, becomes very important that the information travels accurately through the shortest possible route from the sender to the receiver. It becomes all the more difficult since different destinations may have portions of their address in common with each other.

As the number of networks and destinations which are interconnected increases by the day, it is highly important that routers in each network are able to route the information as fast as possible to the final destination. The current technology takes a long time to determine the correct address in a router to route the information. For example, a 16 bit address could require up to 15 clock cycles to be determined in the currently available technology. In networks incorporating a wider address such as 128 bits, it would take more time to accurately determine the address of the final destination.

In computing or in everyday use of computers, it becomes essential to access databases to recover specific information of value. The need for speed of data recovery by the user is closely allied to the need for accuracy of results. One solution in the art to ensure speed and accuracy in the field of data recovery is to convert the applied data into a specific code and to match the applied code entry by entry with the data stored in the database. This process however, is in computing terms quite long drawn. This process works by matching the applied data with the data stored in the database in the form of a range.

The known solutions to the range match problem fall in two categories:

1. Sequential memory based: These solutions typically expand the range field and hence require either a huge memory or multiple accesses to the table.
2. CAM based: These solutions try to split the range search into multiple prefix searches and use a ternary CAM to do these searches. Hence multiple entries are required for each range value and multiple searches are also required.

Thus there is a need for a search cell capable of searching a database in the shortest possible time without compromising on the accuracy of the results.

The applicants' own co-pending application Ser. No. 09/865,241 filed on May 24, 2001 overcomes many of the problems associated with the prior art and discloses a novel search cell for use as a building block of a database and which is capable of performing hierarchical searches in the database as well as a method thereof. The novel search cell of the co-pending application includes a plurality of Logic Content addressable Memory Cells (LCAMS) arranged in rows and columns. Each LCAM cell includes a first and second memory cells, a first comparator coupled to the first and second memory cells for comparing the content of the first memory cell with one bit of a test information. To search for a second data type entry, the search cell searches for the longest prefix entry belonging to the first data type by comparing test information with the entries stored in the first storage unit. Once the longest prefix entry is determined, a corresponding entry in the second storage unit is output as the output of the search cell. The contents of said U.S. patent application are deemed to have been incorporated herein by reference.

Content addressable memory cells are well known in the art and are used to compare a search word with a set of stored words. An indication of whether or not the search word matches the stored words is produced for each stored word. A distinguishing characteristic of a CAM is that each stored word is uniquely identified on the basis of the content of the word itself, rather than by its address within the memory array.

A CAM includes an array of memory cells arranged in a matrix of rows and columns. Each memory cell stores a single bit of digital information. The bits stored in a row of memory elements constitute a stored word. During a match operation, a search word of input data is applied to all the rows, and an indication is produced for each row as to whether or not the search word matches the word stored therein.

An important use for a CAM is to facilitate searches on a conventional indexed random access memory (RAM). The CAM stores a series of "tags" which represent address locations in the RAM. Match operations are performed on the CAM in order to detect the locations of data stored in the RAM. When match data is presented to the CAM, the CAM responds with a "tag" representing the address location in RAM containing the desired data. This address location is then driven to the RAM's address lines in order to access the data.

A conventional content addressable memory has a plurality of word data memories respectively having memory cells, the number of which corresponds to a number of bits of a word. The memory cells are respectively activated by word lines, thereby the data stored in the memory cells are read out respectively via bit lines. Such data read out from the memory cells via the bit lines are respectively supplied to a plurality of match detection-circuits.

Each of the match detection circuits detects whether data on one of the bit lines matches data from a corresponding one of the memory cells, i.e., when a circuit operation signal line which is common to the entire words is in an active state. Each of the match detection circuits activates its corresponding one of match signal lines when the data on the entire bit lines match the data from the memory cells.

When retrieving data in the content addressable memory, the circuit operation signal line needs to be activated, in a state where the word lines are activated and retrieval data are output to the bit signal lines. In this case, if the data stored in the corresponding one of the word data memories, match the retrieval data, its corresponding match detection circuit is activated. By doing this, the data stored in the corresponding one of the word data memories and which match the retrieval data can be extracted. The conventional content addressable memory includes the plurality of match detection circuits respectively corresponding to the word data memories. In this structure, the conventional content addressable memory can simultaneously detect the entire words whether any one of them corresponds to the retrieval data, resulting in retrieving the data at high speed. In this type of content addressable memory, the match detection circuits are operated all at the same time. In such circumstances, a problem occurs in that the content addressable memory consumes a lot of electric power.

Unexamined Japanese Patent Application Kokai Publication No. H9-180468 discloses a content addressable memory, in which data is retrieved in a limited range and a limited number of match detection circuits are activated in order to solve this problem. This content addressable memory has a function for limiting a retrieval range for the following retrieval based on a result of the previous retrieval. In this function, a retrieval range is limited in a series of retrieval processes immediately upon reception of retrieval data, while outputting the word which has been extracted at the end as a retrieval result. In the series of retrieval processes, a retrieval process performed after the retrieval range is further limited is referred to as the "following retrieval", whereas a retrieval process performed before that is referred to as the "previous retrieval".

The content addressable memory has a memory cell array storing data to be retrieved in the unit of words, an OMEGA-register and a K-register, retaining the retrieval data, a match detection circuit array including match detection circuits independent from each word, a retrieval operation determination circuit and a retrieval range limitation circuit. The memory cell array stores as data to be retrieved a string table, for example, representing a dynamic dictionary and being formed using a data compression algorithm.

In the series of retrieval processes, after the previous retrieval, the content addressable memory processes a result of the previous retrieval and stores the processed data in the registers. Before performing the following retrieval, in the content addressable memory, values (information specifying a retrieval range for the following retrieval based on the result of the previous retrieval) which are stored in the registers are read, and a retrieval range is designated by the retrieval range limitation circuit. Accordingly, in the content addressable memory, a word which is in the first position within the retrieval range for the following retrieval is designated using the result of the previous retrieval.

However, in order for the data stored in the memory cell array to be retrieved based on the retrieval data, in the content addressable memory of the Kokai reference, the time for storing the values based on the result of the previous retrieval and the time for designating a retrieval range after reading the values stored in the registers before the following retrieval are required. Therefore, in the content addressable memory, a problem arises in that the previous retrieval is switched over to the following retrieval with loss of time. Such a content addressable memory requires the registers storing the values of the previous retrieval and the circuit, for processing the values of the previous retrieval in the retrieval range limitation circuit. Obviously, the content addressable memory needs a large space as to include such registers and circuit, and consumes a lot of electric power.

Furthermore, in the content addressable memory of the Kokai reference, of a plurality of obtained retrieval results which are assigned priorities, it is difficult to retrieve a retrieval result having the highest priority, since there is no means for designating priorities for the data. Therefore, in the content addressable memory, in a case where the plurality of retrieval results are obtained, the values to be stored in the registers can not be specified, and the data can not be retrieved after setting a retrieval range.

In unexamined Japanese Patent Application Kokai Publication No. H9-180469 a content addressable memory is disclosed wherein a limited number of match detection circuits are activated. However, in such a content addressable memory, the previous retrieval is switched over to the following retrieval with loss of time, and a register storing values of the previous retrieval is required, and further priorities for data pieces cannot be specified when a plurality of retrieval results are obtained.

U.S. Pat. No. 6,181,592 relates to a technique for retrieving data from a plural pieces of data to be retrieved which matches or is similar to input retrieval data. According to this patent, a memory cell array included in a content addressable memory stores words, as data to be retrieved, respectively at a plurality of addresses, each of which is assigned a priority in a descending order. When the data is input, each of a plurality of match detection circuits detects whether the data matches the words. A plurality of circuits retain, of the retrieval data which have been detected, whether the retrieval data matches the corresponding words by the match detection circuits, data stored at an address which is assigned the highest priority, and outputs the data to a retrieval range designation circuit when the following retrieval beings. The retrieval range designation circuit controls each of mask circuits contained in each of the match detection circuits to be in an active state, thereby designating a retrieval range of words within the memory cell array.

Japanese Patent KOKAI Publication JP-A-62-293596 (1987) discloses a conventional content-addressable memory device wherein one word is composed of n bits. The device comprises a decoder which performs a word selection for writing in n-bit data, a first content-addressable memory cell array in which one word is composed of m bits, a first sensing amplifier for sensing the result of a comparison performed by the first content-addressable memory cell array, a second content addressable memory cell array in which one word is composed of n-m bits for performing a comparison operation using the output of the first sensing amplifier, and a second sensing amplifier for sensing the results of comparison by the second content-addressable memory cell array in dependence upon the output of the first sensing amplifier, whereby it is intended that less power is consumed at the time of the comparison operation.

U.S. Pat. No. 6,081,441 discloses a content-addressable memory wherein match selection circuits are connected to respective ones of match lines connecting corresponding rows of CAM cells associated with word lines. A match selection control circuit, the inputs of which are the word lines, generates match line inhibit signals that inhibit a search when a data search is conducted in the CAM. On the basis of a precharge signal from a control circuit and a match line inhibit signal from the match selection control circuit applied thereto, the match selection circuits inhibit a data search in row-direction CAM cells connected to the match lines that are connected to these match selection circuits, respectively, thereby specifying a data search range in terms of individual word lines. A match line corresponding to each word line in the specified search range attains a non-match state regardless of whether the result of a search is a match or non-match. Thus a data search range is specified by the positions of selected word lines. The number of data search operations is reduced and less power is consumed when the CAM operates.

The content-addressable memory of the '441 patent functions to input externally applied search data, which comprises a plurality of bits, and to compare the search data with internally stored data to determine if the data matches. The content-addressable memory includes match selection circuits connected to respective ones of match lines, and a match selection control circuit for controlling the match selection circuits. By specifying a search range in units of word lines and inhibiting compare searches in units of word lines that are outside the search range, compare searches are conducted only on the basis of the remaining individual word lines (i.e., only on the word lines within the specified search range).

U.S. Pat. No. 3,648,254 granted to W. F. Beausoleil on Mar. 7, 1972 discloses the implementation of a CAM using shift registers or other rotating media for storage. They are arranged in such a way as to function as a plurality of word-serial searches operating in parallel. It requires that the stored data rotate past the comparator logic, instead of being read from a RAM based on a rotating pointer.

U.S. Pat. No. 4,145,737 granted to S. M. Lamb et al. on Mar. 20, 1979 discloses the implementation of a CAM using RAM for storage. The comparators are a shared resource, but in a search operation, only one RAM location is selected from each block (the same across all blocks).

U.S. Pat. No. 4,622,653 granted to D. J. McElroy on Nov. 11, 1986 discloses a means of integrating comparators together with a DRAM, accessing all cells in a single row of the DRAM simultaneously (a row referred to as a "block"), thereafter comparing them to reference data, with multiple match lines provided for the multiple words in a physical row, and sequential access means for sequencing through all of the blocks that make up the memory.

U.S. Pat. No. 4,958,377 granted to K. Takahashi on Sep. 18, 1990 discloses many possible embodiments of an associative memory, in which data does not need to be explicitly compared, since the value of a bit is encoded in its position.

A paper by M. Motomura et al. entitled "A 1.2-Million Transistor, 33-MHz, 20-b Dictionary Search Processor (DISP) ULSI with a 160-kb CAM", IEEE Journal of Solid-State Circuits, Vol. 25, No. 5, pp. 1158–1165, October 1990, describes a means of sharing a comparator among multiple SRAM cells using categorization, such that a search is completed in a single cycle, but only one of these SRAM cells is actually compared to the reference data (the one belonging to the selected category). The search of stored data is hence only partial. Though SRAM cells and comparators are grouped into blocks, there are no sub-blocks, no parallel searches per block, and only one match line per column. The match line does not perform any access control function.

A paper by G. J. Lipovski entitled "A Four Megabit Dynamic Systolic Associative Memory Chip", Journal of VLSI Signal Processing, Vol. 4, No. 1, p. 3751, 1992 (also U.S. Pat. No. 4,989,180 issued on Jan. 29, 1991), describes a means of storing CAM data in DRAM core cells, which share access to a comparator on a TDM (time division multiplex) basis. The entire contents of the CAM is searched in a single search operation, but the embodiment of this operation is most likely serialized by bit, rather than by word. Row access is controlled by a counter and address signals, rather than shift registers. The plurality of bits belonging to each word are all processed (compared) in the same comparator.

A paper by I. N. Robinson entitled "Pattern-Addressable Memory", IEEE Micro, pp. 20–30, June 1992, describes a structure in which CAM data are stored in DRAM cells, which share a comparator. Access is on a word-by-word basis and is normally performed in some pre-determined order. Rows are selected by address lines and decoders, as controlled by an "array controller", rather than deterministically by shift registers. There is a plurality of blocks on the chip, but each block contains a plurality of complete data words, and blocks are not sub-blocked. Match lines are confined to the "match engine" associated with each block, and do not run above DRAM cells.

U.S. Pat. No. 4,747,072 granted to I. N. Robinson et al. on May 24, 1988 discloses searching circuitry composed of a plurality of "retrieval processors", each with an associated bank of RAM. RAM access is controlled by a shift register, thus arbitrating access to the comparator resource in the processor. Although the access pattern, as controlled by the shift register, is sequential, it is not deterministic (fixed TDM). The processor, itself, may contain considerable circuitry in addition to the comparator, for the intended purpose of controlling the search for a sequence of entries, rather than a single isolated entry.

U.S. Pat. No. 4,794,559 granted to A. J. Greenberger on Dec. 27, 1988 discloses a means of achieving content-addressable functionality using standard DRAM storage array(s). Fixed TDM sharing of the comparator may be employed. Though the memory chip may be divided into separate blocks for the purpose of searching multiple words in parallel, these blocks are oriented such that only a single word line is asserted per cycle (said word line spans a plurality of blocks), and the match line is parallel to the word line, rather than parallel to the bit lines.

In a paper by K. J. Schultz et al. entitled "Architectures for Large-Capacity CAMs", INTEGRATION: the VLSI Journal, Vol. 18, pp. 151–171, 1995 describes, in a general tutorial fashion (pp. 158–161), an architecture employing multiple blocks being searched in parallel.

A significant problem with prior art range matching techniques using CAM cells is that a large number of search operations are required to achieve a single match. A data search in the conventional CAM is carried out for every address and every word and searches may become redundant, or may be performed a number of times equivalent to the number of word lines, depending upon the content of the search data. In other words, if, when data in another memory device is read out using an address that has been detected in the CAM, multiple items of data that have been stored in the memory portions of the CAM cells are identical, searches are conducted until the desired information is obtained and the number of times this is done is the same as the number of identical items of stored data.

Another problem is the flow of unnecessary current, which results in increased power consumption. When a match is obtained as the result of a data search in CAM cells all connected to match lines of associated word lines in a content addressable memory device composed of the conventional CAM cells, the match lines are charged and discharged by the conduction of transistors in the data search portions of the CAM cells. Consequently, the number of words and the bit length are large and an increase in power consumption is the result. The reason for this is that when the results of comparison in regard to an individual word line is indicative of a total match, all of the data search portions of the CAM cells operate, the potential of the match line charged prior to the search operation is discharged and needless power is produced.

OBJECTS OF THE INVENTION

Accordingly, the main object of the present invention is to provide a content-addressable memory in which the number of data search operations is reduced and less power is consumed when the CAM operates.

It is another object of the invention to provide a content addressable memory enabling range check for data input which is speedy and avoids the need for data check entry by entry in a multiplicity of cycles.

It is a further object of the invention to provide a range check technique which does not require a large memory space.

It is a further object of the invention to provide a range check technique which does not require multiple access to the stored data table.

It is yet another object of the invention to provide a range check technique which obviates the necessity for multiple entries for each range value and multiple searches for each range value.

It is a further object of the invention to provide a technique for the matching of a data input with a collection of stored data which does not require additional hardware or silicon area thereby reducing the cost of processing.

The range check CAM cell of the invention utilizes a conventional SRAM cell for storage of the data range. The stored data range is determined by the user depending on user requirements. All data whether stored or applied is in binary form. In the basic range check technique of the invention, applied data is compared with stored data bits from the most significant bit (MSB) to the least significant bit (LSB).

While the range check is provided with different cells for upper, lower and equality check, it can also be implemented with only one type of cell, either greater than, equal to, or less than equal by storing appropriate data. The greater than equal to (GTEQ) cell output is true if the stored data is greater than or equal to applied data. Similarly, less than equal to (LTEQ) cell output is true if stored data is less than or equal to applied data.

When comparison is done from MSB to LSB, for LTEQ cell, if the stored data bit is greater than applied the data bit, then stored data is greater than applied data. In such an event, the match line is pulled down and the remaining data bits to be compared are not checked. Again when comparison is done from MSB to LSB, if the stored data bit is less than the applied data bit, for the LTEQ cell, stored data is less than applied data and the remaining bits are not checked. In the case of check for equality or perfect match of applied data with stored data, all bits of stored data and applied data must be equal.

The range check cell of the invention comprises an upper limit field and a lower limit field with a match detector. The range CAM word of the invention facilitates the determination of a range match by comparing incoming data with the Upper and Lower Limit values stored in the range check cell.

In the prior art methods of range check using a SRAM cell simpliciter, each applied data bit was compared with each entry in the stored data. Typically this meant 16 K cycles of comparison for 16 K of applied data and required large amounts of time for comparison. In the present invention, the applied data is compared in parallel with each stored data bit thereby reducing both time taken for comparison and the size of the co-processor.

DETAILED DESCRIPTION OF PREFERRED EMBODIMENTS

The upper limit cells in the greater than or equal to range cells (UL[n:0]) comprises of n+1 Upper Limit Range Cells (GTEQ) and stores the upper limit of the range entry contained in the Range Word. The incoming data D[n:0] is compared with the stored value UL[n:0]. When the incoming data is less than or equal to the stored data, the match level is high and the match holds true.

The lower limit field (LL[n:0]) comprises of n+1 lower limit range cells (LTEQ) and stores the lower limit of the range entry contained in the range word. The incoming data D[n:0] is compared with the stored value LL[n:0]. When the stored lower limit of the range entry is less than or equal to the input data bit, the match output is high and the comparison holds true. The match detector ANDS the match outputs from the upper limit and lower limit fields in order to determine the final match for the range CAM word. A sample basic range check cell is given in Table I below.

TABLE I

| Upper Limit Field | Match Detector | Lower Limit Field |
|---|---|---|
| UL[cn]  ...   ... UL[0] | | LL[n]  ...   ... LL[0] |

Table II below provides a sample range check using GTEQ for upper limit and LTEQ for lower limit (for a 16 bit data maximum upper limit=FFFF)

TABLE II

| Data | Upper Limit | Lower Limit | Comment |
|---|---|---|---|
| >33 | FFFF | 34 | Range Check |
| >=257 | FFFF | 257 | Range Check |
| 71–61 | 71 | 61 | Range Check |
| <133 | 132 | 0000 | Range Check |
| <=1006 | 1006 | 0000 | Range Check |
| 213 | 213 | 213 | Exact Match |
| 12** | 12FF | 1200 | Prefix Match |
| * | FFFF | 0000 | Ignore Function |

Range check can also be done using GTEQ for both upper and lower limit check. In this case, ones complement (inverted data) is stored in the lower limit. Also ones complement is applied during the range check to the lower limit. (Example: for a 16 bit data the maximum upper limit=FFFF).

Table III provides a representation of such a range check using GTEQ for both upper and lower limit check.

TABLE III

| Data | Upper Limit | Lower Limit | Comment |
|---|---|---|---|
| >33 | FFFF | FFCB | Range Check |
| >=257 | FFFF | FDA8 | Range Check |
| 71–61 | 71 | FF9E | Range Check |
| <133 | 132 | FFFF | Range Check |
| <=1006 | 1006 | FFFF | Range Check |
| 213 | 213 | FDEC | Exact Match |
| 12** | 12FF | EDFF | Prefix Match |
| * | FFFF | FFFF | Ignore Function |

Similarly, basic range check can be done using LTEQ for both upper limit and lower limit. In this case, ones complement (inverted data) is stored in the upper limit. Also ones complement is applied during the range check to the upper limit. (Ex. For 16 bit data maximum upper limit=FFFF). A representation of such a basic range check using a LTEQ cell is provided in Table IV below:

TABLE IV

| Data | Upper Limit | Lower Limit | Comment |
|---|---|---|---|
| >33 | 0000 | 34 | Range Check |
| >=257 | 0000 | 257 | Range Check |
| 71–61 | FF8E | 61 | Range Check |
| <133 | FECD | 0000 | Range Check |
| <=1006 | EFF9 | 0000 | Range Check |
| 213 | FDEC | 213 | Exact Match |
| 12** | ED00 | 1200 | Prefix Match |
| * | 0000 | 0000 | Ignore Function |

The present invention will now be described in greater detail with reference to the accompanying drawings wherein.

Figure 1:
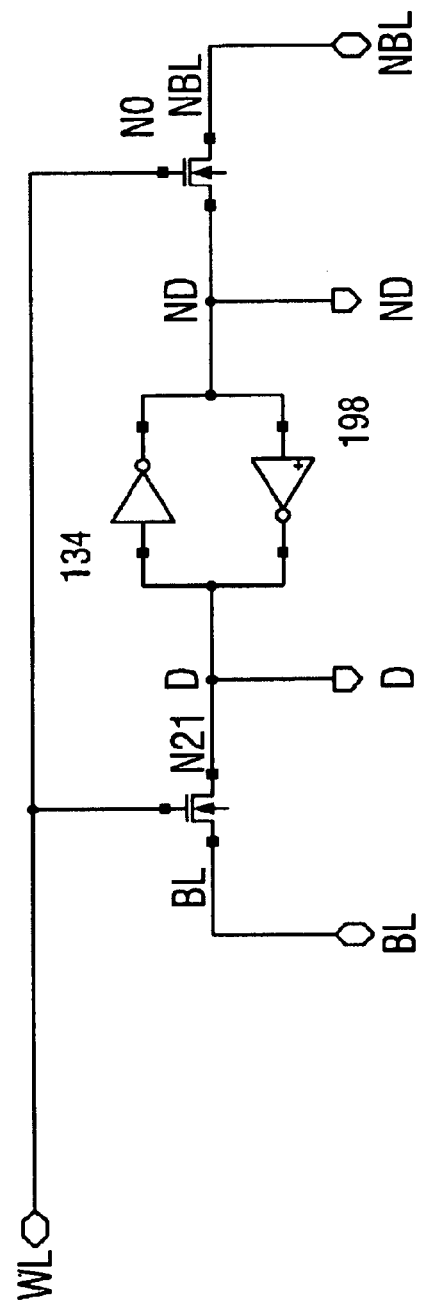
FIG. 1 is a schematic diagram of a conventional SRAM cell used in the range check CAM cell of the invention.

Referring to the drawings, FIG. 1 is a schematic diagram of the conventional SRAM cell used as part of the invention. The stored data is written in a conventional SRAM cell. The SRAM cell is connected to a word line (WL), a bit line (BL) and an invert of the bit line (NBL). The stored data is written through BL/NBL and WL. To write 0, BL=0 and NBL=1 when WL is asserted (WL=1). As a result, gate N21 and N0 (nmos transistors) are closed. Thus, data gets written to the SRAM. To write 1, BL=1 and NBL=0 when WL is asserted (WL=1).

Basic Range Cell (GTEQ)

Figure 2:
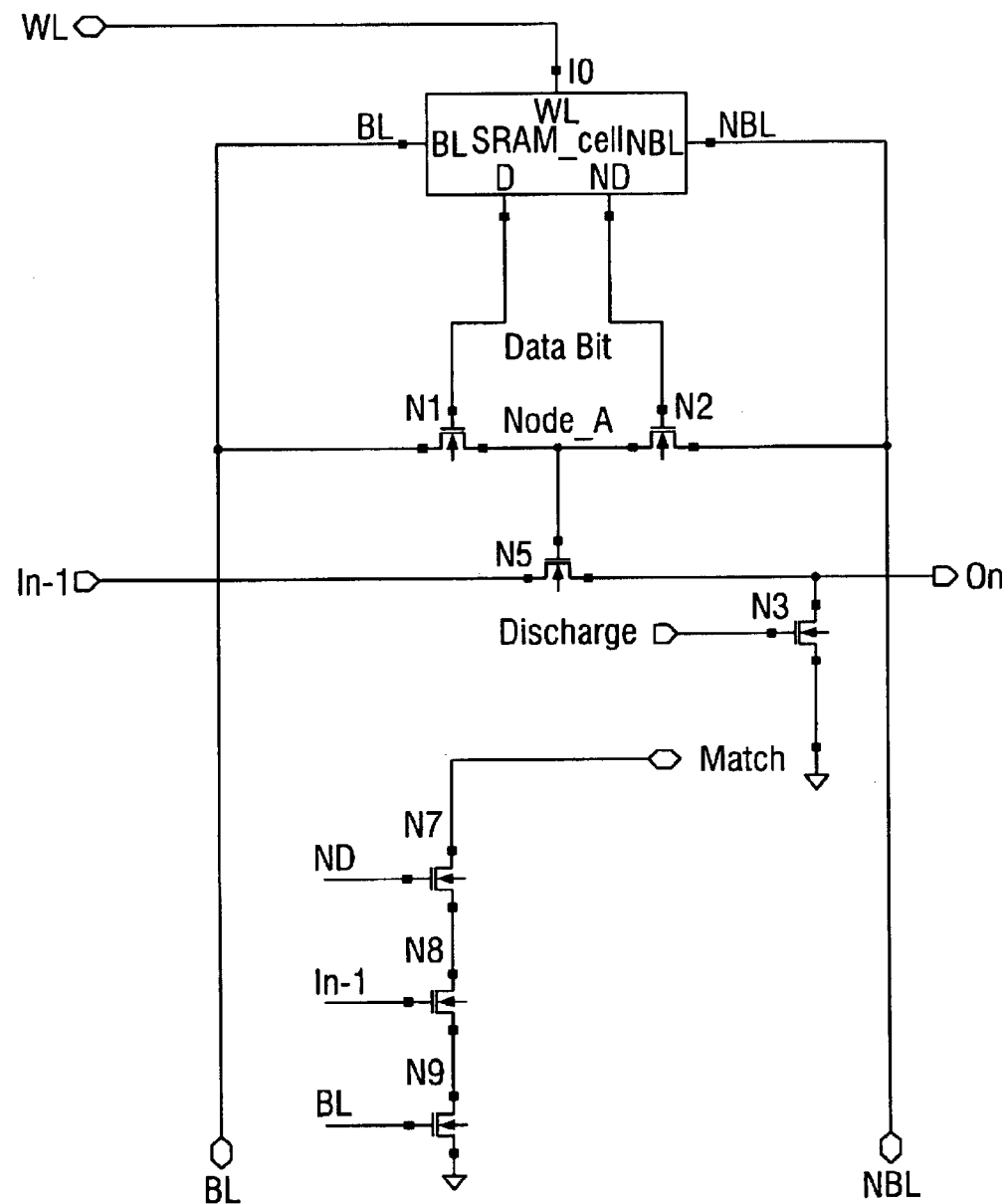
FIG. 2 is a schematic diagram of a basic range check cell with greater than equal to function according to the invention.

FIG. 2 provides a schematic diagram of the basic range check cell of the invention with greater than or equal to (GTEQ) function. The basic range cell has a SRAM cell and logic to perform greater than and equal to function. The GTEQ cell also comprises an input In-1 and an output On connected thorough a nmos gate N5. The data to be checked is applied through BL and NBL. Bit line BL and inverse NBL are connected to the SRAM cell. The SRAM cell is provided with nodes D and ND such that when the stored data is 0, D=0 and ND=1 and when stored data=1, D=1 and ND=0. D and ND are connected to a logic node Node_A through respective nmos gates N1 and N2. Node_A is provided with a logic function to read the data arriving there from the SRAM cell. Node_A is in turn connected to nmos gate N5 and controls the operation of gate N5. BL, In-1, and ND are also connected to three nmos gates N9, N8, and N7 respectively which are in turn connected in series to a match line MATCH. In-1 and On are also provided with another nmos gate N3 which is controlled again in turn by the output of Node_A. N3 leads to the discharge.

The range check cell checks the applied data and stored data only if previous bits are equal. The equality of previous bits is passed on output node On to input node In-1 of next bit. The range is checked by checking stored bits from MSB to LSB. For the first bit of a word (MSB), In-1 is connected to the power supply VDD. DISCHARGE is asserted at the start to initialize On node.

When the stored data in the SRAM cell is 0 the D node is 0 and ND node is 1. The MATCH line is charged to voltage source VDD before applying data. If the applied data to be checked is 0, BL=0 and NBL=1. If the previous bits are equal, the input In-1 is also 1. In this case, Node_A will be 1 through nmos gate N2. Logic 1 at Node_A passes the value of In-I to On through nmos gate N5. As In-1 is 1, On will be 1 thereby indicating that the applied data is equal to stored data. Since BL is 0, nmos gate N9 will be OFF. As a result the MATCH line is not pulled down, thereby indicating that applied data is less than or equal to stored data. The value of On is finally detected by the match detector (not shown in FIG. 2).

Another example of how data is checked by the GTEQ cell is when stored Data=0 and the data to be compared is=1. Since the data in SRAM cell is 0 the D node is 0 and ND node is 1. The MATCH line is charged to VDD before applying the data. To compare 1, BL=1 and NBL=0. If the previous bits are equal then In-1 is also 1. Since ND is 1, Node_A will be 0 through N2. Logic 0 from NBL at Node_A prevents the passage of In-1 to-On. As a result On remains 0 and the input to the next cell's In-1 remains 0. This disables the comparison of the next bit as range result is known during this check. The MATCH line is pulled down as ND=1, In-1=1 and BL=1 which turns on N7, N8 and N9. The discharge of MATCH line indicates that applied data is greater than stored data and is detected by the match detector.

When stored data and the applied data are both 1, the D node is 1 and ND node is 0. MATCH line is charged to VDD before applying the data. To compare applied data 1, BL=1 and NBL=0. If the previous bits are equal then In-1 is also 1. Node_A is therefore 1 through nmos gate N1. Logic 1 at Node_A passes the value of In-1 to On through N5. As In-1 is 1, On will be 1 which indicates that applied data is equal to stored data. The MATCH line is not pulled down as ND=0 and N7 is off, which indicates that applied data is less than or equal to stored data which is detected by the match detector.

When the data to be checked is 0 and the stored data is 1, the D node is 1 and ND node is 0. MATCH line is charged to VDD before applying the data. To compare applied data 0, BL=0 and NBL=1. If the previous bits are equal then In-1 is also 1. Node_A will be 0 through N1. Logic 0 at Node_A does not pass In-1 to On. As a result, On remains 0. This disables the comparison of the next bit comparison since the input In-1 of the next cell is also 0. Since the applied data is less than the stored data, the match line is not pulled down as ND=0 turning off nmos gate N7.

Figure 3:
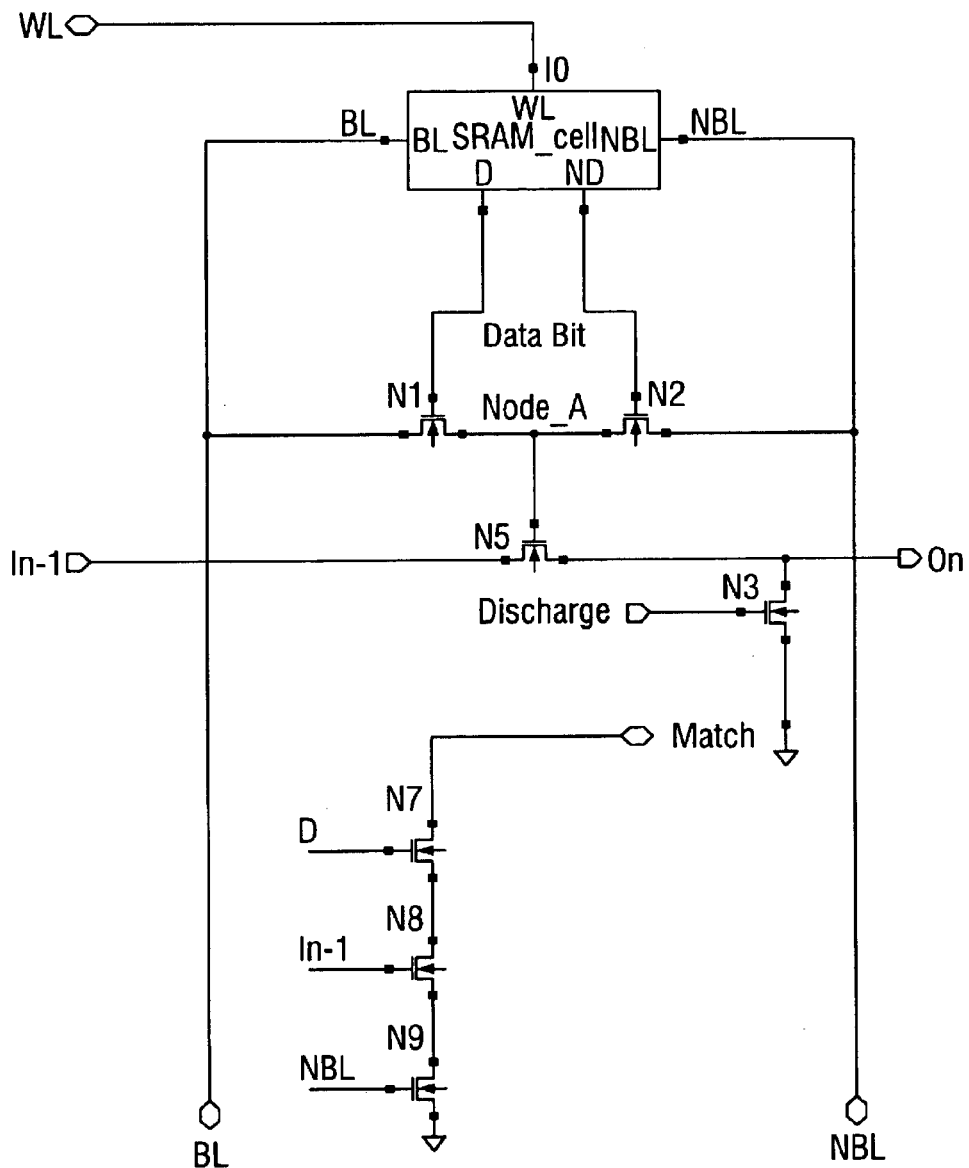
FIG. 3 is a schematic diagram of a basic range check cell with less than equal to function according to the invention.

The GTEQ cell is converted to LTEQ by changing ND to D for N7 and BL to NBL for N9 as shown in FIG. 3. The technique for checking the range value remains the same.

The basic range cell has a SRAM cell and logic to perform greater than and equal to function. The LTEQ cell comprises an input node In-1 and an output node On connected thorough a nmos gate N5. The data to be checked is applied through BL and NBL. Bit line BL and inverse NBL are connected to the SRAM cell. The SRAM cell is provided with nodes D and ND such that when the stored data is 0, D=0 and ND=1 and when stored data=1, D=1 and ND=0. D and ND are connected to a logic node Node_A through respective nmos gates N1 and N2. Node_A is provided with a logic function to read the data arriving there from the SRAM cell. Node_A is in turn connected to nmos gate N5 and controls the operation of gate N5. NBL, In-1, and D are also connected to three nmos gates N9, N8, and N7 respectively which are in turn connected in series to a match line MATCH. In-1 and On are also provided with another nmos gate N3 which is controlled again in turn by the output of Node_A. N3 leads to the discharge.

The range check cell checks the applied data and stored data only if previous bits are equal. The equality of previous bit is passed on output node On to input node In-1 of next bit. The range is checked by checking stored bits from MSB to LSB. For the first bit of a word (MSB), In-1 is connected to the power supply VDD. DISCHARGE is asserted at the start to initialize On node.

When the stored data in the SRAM cell is 0 the D node is 0 and ND node is 1. The MATCH line is charged to voltage source VDD before applying data. If the applied data to be checked is 0, BL=0 and NBL=1. If the previous bits are equal, the input In-1 is also 1. In this case, Node_A will be 1 through nmos gate N2. Logic 1 at Node_A passes the value of In-1 to On through nmos gate N5. As In-1 is 1, On will be 1 thereby indicating that the applied data is equal to stored data. Since D is 0, nmos gate N7 will be OFF. As a result, the MATCH line is not pulled down, thereby indicating that applied data is greater than or equal to stored data. The value of On is finally detected by the match detector (not shown in FIG. 3).

Another example of how data is checked by the LTEQ cell is when stored Data=0 and the data to be compared is=1. Since the data in SRAM cell is 0, the D node is 0 and ND node is 1. The MATCH line is charged to VDD before applying the data. To compare 1, BL=1 and NBL=0. If the previous bits are equal, then In-1 is also 1. Since ND is 1, Node_A will be 0 through N2. Logic 0 from NBL at Node_A prevents the passage of In-1 to On. As a result, On remains 0 and the input to the next cell's In-1 remains 0. This disables the comparison of the next bit as range result are known during this check. The MATCH line is not pulled down as D=0 and NBL is also 0 leaving N7 and N9 respectively off. This indicates that the applied data is greater than stored data and is detected by the match detector.

When stored data and the applied data are both 1, the D node is 1 and ND node is 0. MATCH line is charged to VDD before applying the data. To compare applied data 1, BL=1 and NBL=0. If the previous bits are equal then In-1 is also 1. Node_A is therefore 1 through nmos gate N1. Logic 1 at Node_A passes the value of In-1 to On through N5. As In-1 is 1, On will be 1 which indicates that applied data is equal to stored data. The MATCH line is not pulled down as NBL=0 and N9 is off, which indicates that applied data is greater than or equal to stored data which is detected by the match detector.

When the applied data to be checked is 0 and the stored data is 1, the D node is 1 and ND node is 0. MATCH line is charged to VDD before applying the data. To compare applied data 0, BL=0 and NBL=1. If the previous bits are equal, then In-1 is also 1. Node_A will be 0 through N1. Logic 0 at Node_A does not pass In-1 to On. As a result, On remains 0. This disables the comparison of the next bit comparison since the input In-1 of the next cell is also 0. The match line is pulled down as D=1, In-1=1 and NBL=1 which turns on nmos gates N7, N8 and N9 respectively indicating that the applied data is less than the stored data.

Figure 4:
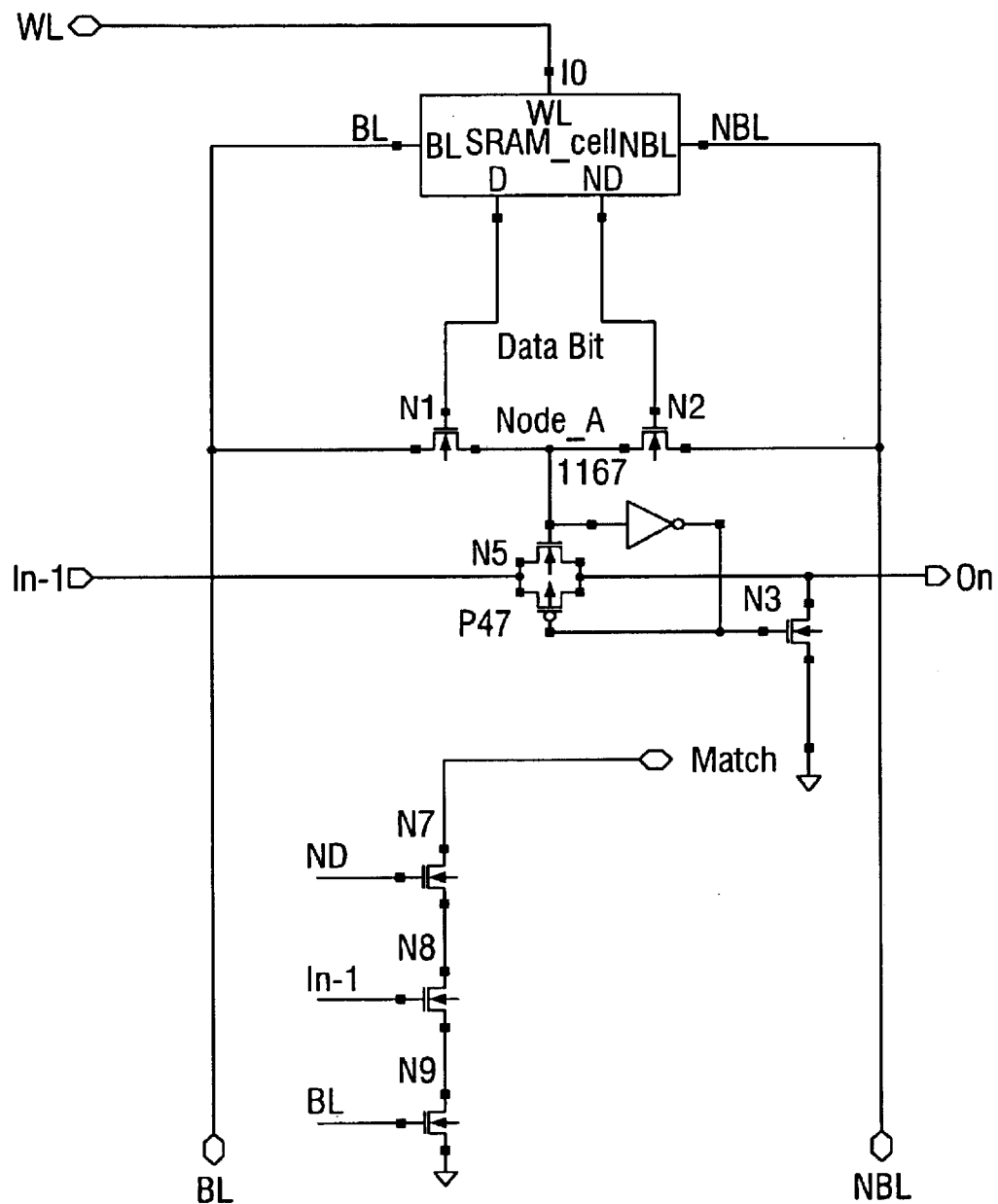
FIG. 4 is a schematic-diagram of one embodiment of the range check cell of the invention with greater than equal to function and wherein the output node is run by the compare result obviating the need for a discharge signal.

In FIG. 4, the requirement to precharge the DISCHARGE signal is obviated since the node On is driven by the cell depending on the compare result. Unless stated to the contrary, the terms and reference indications for FIG. 4 are identical to those of FIG. 2 and FIG. 3.

When Stored Data=0 and the Applied Data=0

Since the stored data in the cell is 0, the D node is 0 and ND node is 1. The MATCH line is charged to the power source VDD before applying the data. BL=0 and inverse NBL=1 when the applied data is 0. If the previous bits are equal then the input In-1 is also 1. Since NBL value is 1, the value transferred to Node_A is 1 through nmos gate N2. As a result, the Logic 1 at Node_A turns on the pass gate comprising of the pmos gate P47 and the nmos gate N5 to pass value of In-1 to On. Inverter 167 converts the value of 1 to 0 such that the pmos gate P47 turns on. The value of 1 from Node_A directly turns on nmos gate N5. As a result, the In-1 value of 1 gets transferred to output On indicating that the applied data is equal to stored data. The value of 0 obtained from the inverter 167 is also transferred to nmos gate N3 which therefore remains shut ensuring that discharge does not occur and the On line does not get pulled down. Since BL=0, nmos gate N9 remains shut thereby also ensuring that the MATCH line is not pulled down. The match result is finally detected by the match detector (not shown in FIG. 4).

When Stored Data=0 and Applied Data=1

Since the stored data in the cell is 0, the D node is 0 and ND node is 1. The MATCH line is charged to VDD before applying the data. In order to apply a check for data 1, BL must be 1 and NBL must be 0. Again, if the previous applied bits are equal, then the input In-1 is 1. As a result of NBL being 0, and ND being 1, Node_A is 0 through nmos gate N2. Therefore Logic 0 at Node_A closes the pass gate (P47-N5). Logic 0 that is passed through Node_A does not turn on nmos gate N5. Logic 0 passed through Node_A is converted by inverter 167 to 1. As a result pmos gate P47 remains shut and nmos gate N3 to the discharge is on. This ensures that the value of In-1 does not get passed on to output On and On is pulled down through gate N3. This also disables the comparison of the next bit comparison. The MATCH line is also pulled down since BL=1, In-1=1 and ND=1, thereby turning on nmos gates N7, N8 and N9 respectively. The discharge of the MATCH line indicates that the applied data is greater than the stored data.

When Stored Data=1 and Applied Data=1

Since the stored data in cell is 1 the D node is 1 and ND node is 0. The MATCH line is charged to VDD before applying the data to be checked. In order to apply a data of value 1 for check, BL must be 1 and NBL must be 0. Again, if the previous bits are equal, then the input In-1 is also 1. As a result, the Node_A is 1 through nmos gate N1. Logic 1 at Node_A turns on the pass gate (P47-N5) to pass the value of input In-1 to output On. Logic 1 at Node_A on one hand directly acts on nmos gate N5 and on the other hand is inverted to 0 by inverter 167 to open pmos gate P47. The inverted value of 0 from inverter 167 also ensures that nmos gate N3 remains off thereby ensuring that DISCHARGE is not activated. Since In-1 and On are both 1, the detector indicates that the applied data is equal to stored data. The MATCH line is not pulled down since ND=0 and N7 is off. This also indicates that the applied data is less than or equal to stored data.

When Stored Data=1 and Applied Data=0

Since the stored data in the cell is 1, the D node is 1 and ND node is 0. The MATCH line is charged to VDD before applying the data. In order to apply a value of 0 for checking, BL must be 0 and NBL must be 1. If the previous bits are equal then input In-1 is also 1. Since BL is 0 and D is 1, Node_A is 0 through nmos gate N1. The Logic 0 at Node_A closes the passgate (P47-N5). Nmos gate N5 is off since the logic at Node_A is 0. Logic 0 at Node_A is inverted to 1 through inverter 167. As a result, pmos gate P47 remains off and nmos gate N3 leading to discharge is on. This pulls down output On through nmos gate N3. Since On is 0, the comparison with the next bit does not take place since the range result is known during this check. However, it is important to note that the MATCH line is not pulled down since ND=0 which turns off N7, thereby indicating that the applied data is less than stored data.

Previous Bit Makes Decision

The range decision is made by the previous cell. Thus, when On is 0, the next cell gets an input of In-1=0. As a result nmos gate N8 is turned off and the MATCH line remains unaffected by next cell. The next cell also passes On=0, such that the following cell does not affect MATCH line and so on.

Figure 5:
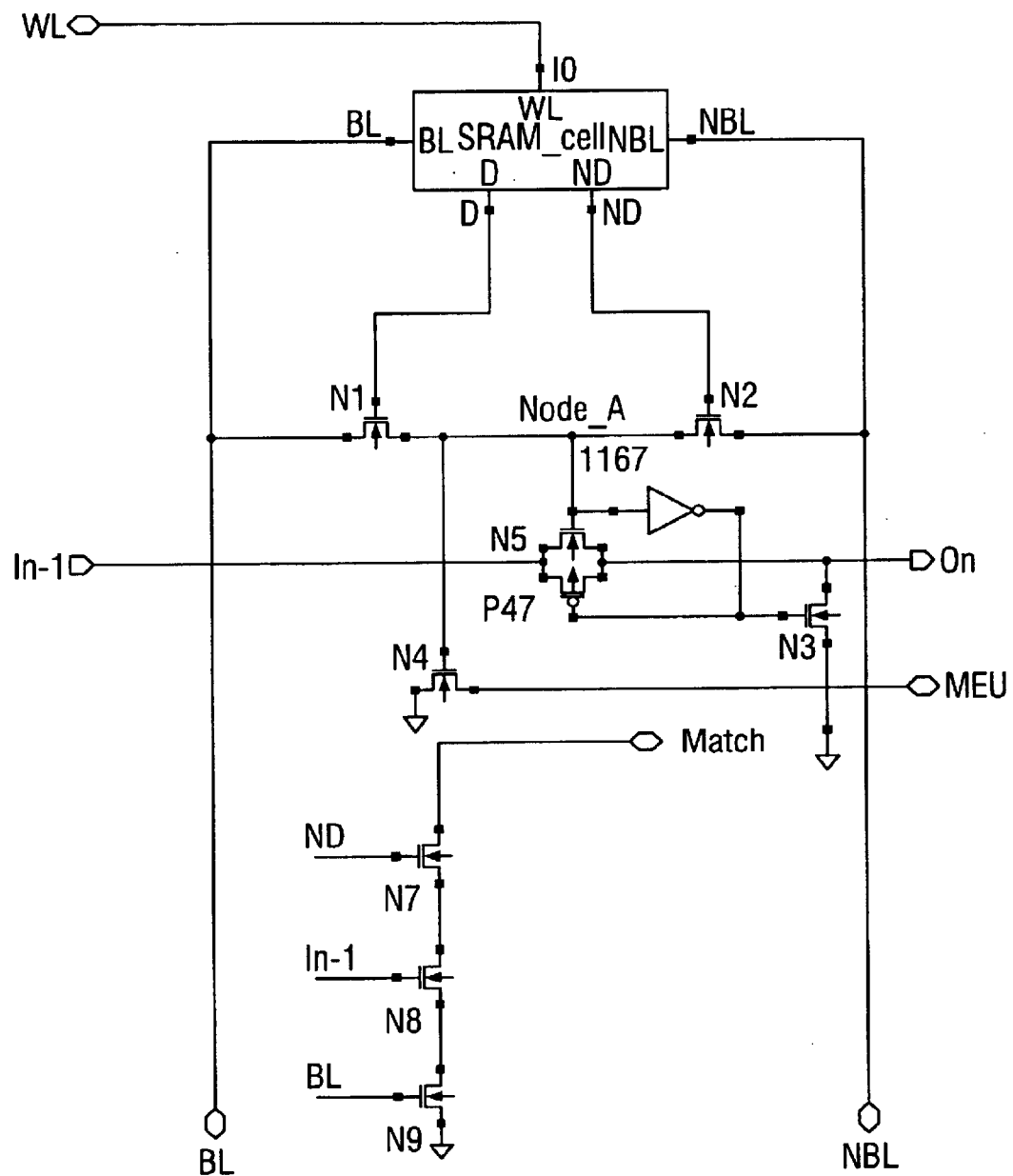
FIG. 5 is a schematic diagram of another embodiment of the range check cell of the invention with greater than equal to function and wherein equal to or perfect match is enabled without requiring a further set of comparison of data bits.

FIG. 5 shows schematically another embodiment of the range check cell of the invention with GTEQ wherein equal to or perfect match is enabled without requiring a further set of comparison of data bits.

For an exact match wherein the applied data is equal to the stored data, the range cells described above in FIGS. 2 and 4 propagate the equality through the pmos and nmos pass transistor combination (P47-N5). Hence, if the applied and stored data are of 16 bits, 16 passtransistors in series are required. The equality is indicated by assertion of the output On of the LSB bit. While this technique is adequate if the frequency of data comparison is not very high because of 16 passtransistors in series, an increase in the bit size would require more passtransistors in series, thereby resulting in a further reduction in speed. This problem arises since the equality condition is passed from MSB to LSB through the input In-1 and output On terminals. Therefore, when all the bits are equal, to indicate an exact match, output On of the LSB becomes high after propagating from MSB to LSB.

It is often required to make the range check cell work at higher frequencies for equal match. To ensure this, an extra transistor N4 and an extra line (MEU) are added as depicted in FIG. 5. The line MEU is precharged to logic high, but pulled down to logic low in the event of a mismatch in any one of the bits being compared in parallel. As a result, the detector senses the MEU line. Since all the bits are being compared in parallel by the transistors N1, N2 and N4, as soon as there is a mismatch in any of the bits, the MEU line is pulled down and sensed by the detector. Thus, the next cell does not have to wait for input In-1 from the output On of the previous cell. The complement value of the data to be applied is forced on the bit line BL.

When the Stored Data=0 and Applied Data 0

Since the stored data in cell is 0, the D node is 0 and ND node is 1. MEU line is kept at logic high. Since the data to be applied is 0, in order to check for equality or mismatch, BL must be 1 and NBL must be 0. As a result Node_A has a logic of 0 resulting in zero voltage at nmos gate N4 through nmos gate N2 and the MEU line is not pulled down thereby indicating that there is no mismatch.

When Stored Data=0 and Applied Data=1

Since stored data in the cell is 0, the D node is 0 and ND node is 1 Since the data to be applied is 1, in order to check for equality or mismatch, BL must be 0 and NBL must be 1. This results in a high voltage at the gate of N4 through N2, and MEU line is pulled down thereby indicating that there is a mismatch. Therefore MEU line is pulled down to logic low.

When Stored Data=1 and Applied Data=0

Since the stored data in the cell is 1, the D node is 1 and ND node is 0. Since the data to be applied is 0, to check for equality or mismatch, BL must be 1 and NBL must be 0. This results in high voltage at the gate of N4 through N1, and MEU line is pulled down thereby indicating that there is a mismatch. MEU line is pulled down to logic low.

When Stored Data=1 and Applied Data=1

Since the stored data in the cell is 1, the D node is 1 and ND node is 0. Since the data to be applied is 1, to check for equality or mismatch, BL must be 0 and NBL must be 1. This results in zero voltage at the gate of N4 through N1, and MEU line is not pulled down, thereby indicating that there is no mismatch. MEU line is kept at logic high.

Figure 6:
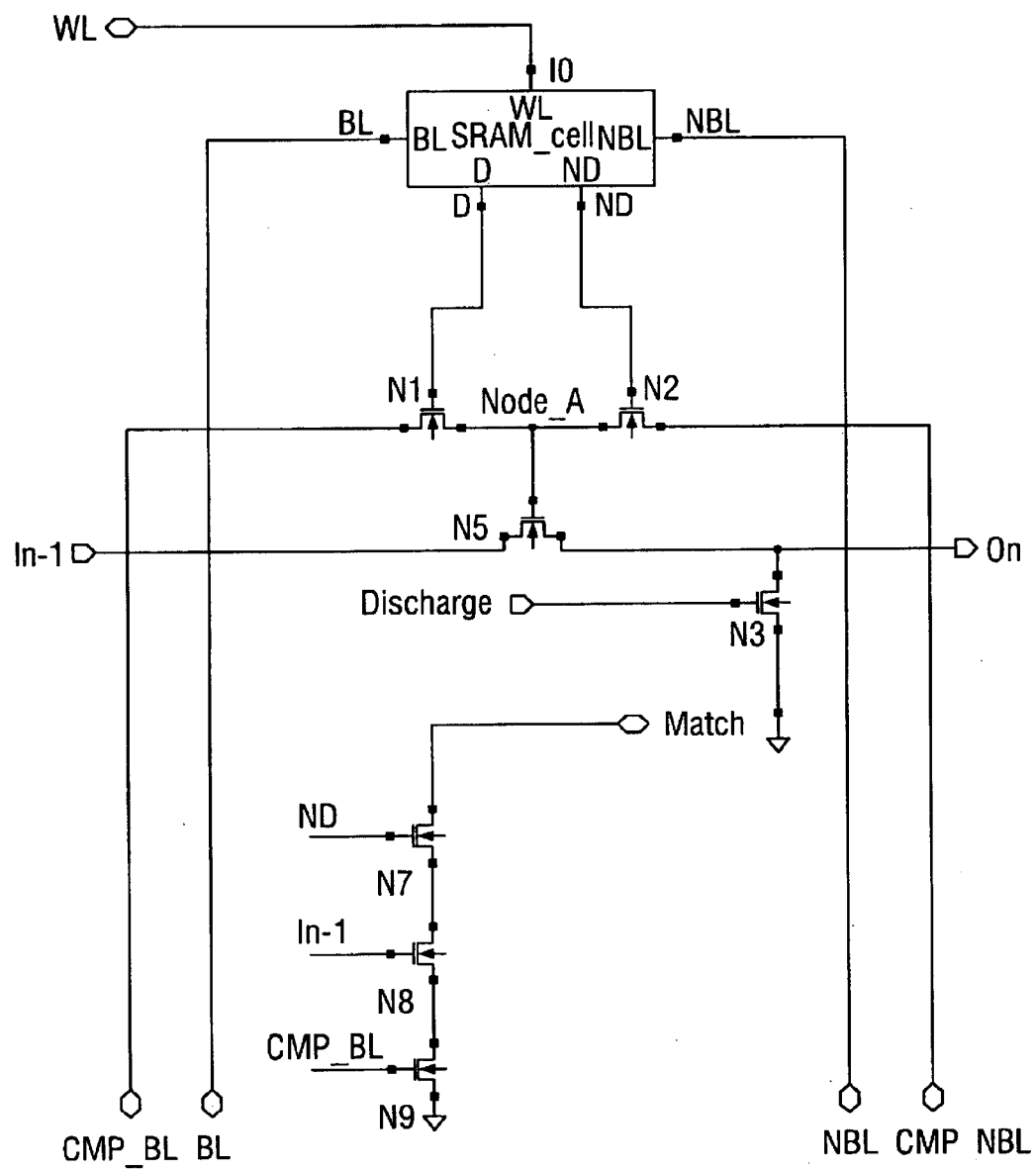
FIG. 6 is a schematic diagram of another embodiment of the invention showing the reduction of the load on the bit line and the inverted bit line by the provision of additional compare bit line and inverse bitline.

FIG. 6 is a schematic of another embodiment of the invention showing the reduction of the load on the bit line and the inverted bit line by the provision of an additional compare bit line and inverse bitline. In this improvement, the load on BL/NBL is reduced by routing another CMP BL/CMP NBL (compare bit line/compare bit line inverse) for range check.

Figure 7:
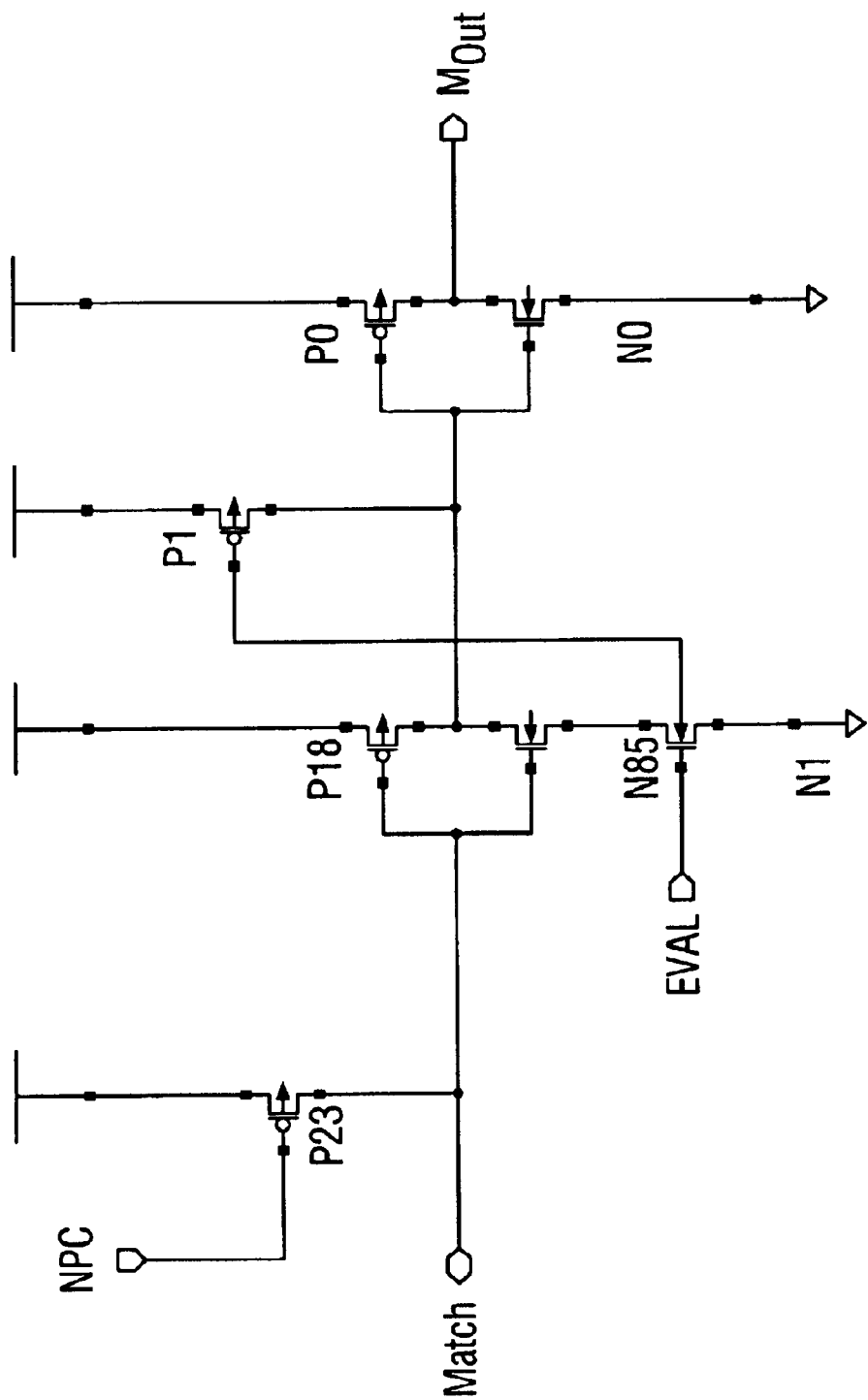
FIG. 7 is a schematic diagram of a match line detector used in the range check cell of the invention.

FIG. 7 is a schematic-of the match line detection means used in the range check cell of the invention.

The match line detection means comprises an external pre-charge control NPC, and a control signal EVAL. The MATCH line is initially pre-charged to the power source VDD by asserting NPC during each check. After applying data for check, the match line settles to its final value after the range check is completed from MSB to LSB. When the control signal EVAL is asserted and the MATCH line is not discharged, MOUT will be 1 indicating that there is match. If the MATCH line is discharged, MOUT will be 0 indicating that there is a mismatch.

Figure 8:
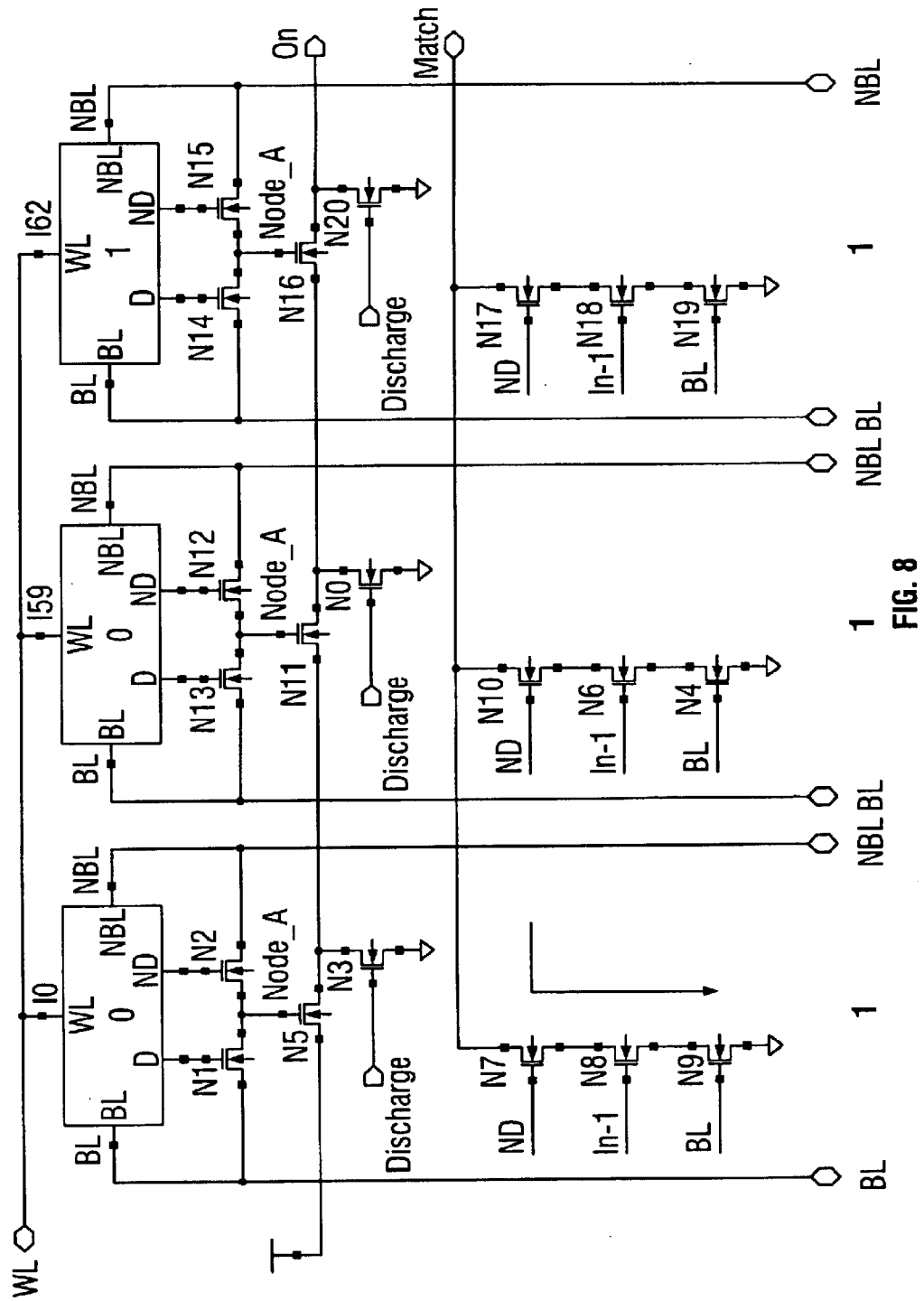
FIG. 8 is a schematic diagram of a basic range check using GTEQ showing comparison of applied data with stored data with a mismatch at the first bit.

FIG. 8 is a schematic of mismatch of a first bit using the GTEQ range cell of the invention.

In this embodiment, the stored data is 001 and the applied data is 111. The first bit of applied data is applied to the range check cell. Since the stored data in the cell is 0, the D node is 0 and ND node is 1. The MATCH line is charged to VDD before applying the data. In order to apply a check for the applied first data bit 1, the data applied at BL is 1 and NBL is 0. As a result of NBL being 0, and ND being 1, Node_A is 0 through nmos gate N2. Therefore Logic 0 at Node_A turns off the pass gate N5. When a combination of a pmos gate P47 is also used in parallel with nmos gate N5, Logic 0 passed through Node_A is converted by inverter 167 to 1. As a result pmos gate P47 remains off and nmos gate N3 to the discharge is on. This ensures that the value of the input does not get passed on to output On and On is pulled down through gate N3. This also disables the comparison of the next bit comparison. The MATCH line is also pulled down since ND=1, In-1=1 and BL=1 thereby turning on nmos gates N7, N8 and N9 respectively. The discharge of MATCH line indicates that applied data is greater than stored data and that there has been a mismatch in the first applied data bit.

Figure 9:
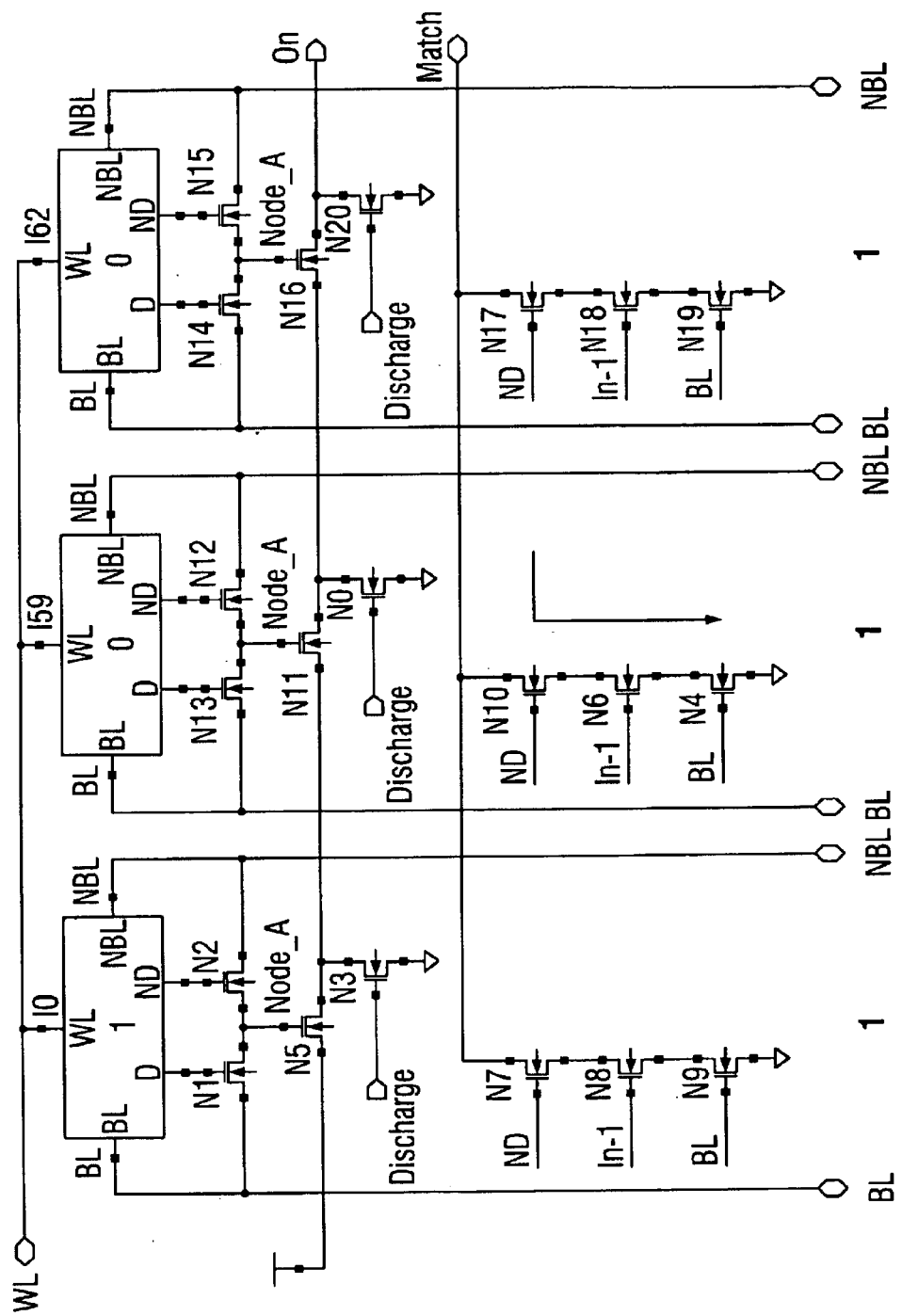
FIG. 9 is a schematic diagram of a basic range check using GTEQ showing a comparison of applied data with stored data with a mismatch at an intermediate bit.

FIG. 9 is a schematic of a basic range check using GTEQ showing a comparison of applied data with stored data wherein there is a mismatch at an intermediate bit. In this embodiment, the stored data is 100 and the applied data is 111. Since the first bit of stored data in the first cell (A) is 1, the D node is 1 and ND node is 0. Data bit to be compared 1 is applied at BL and NBL is therefore 0. As a result, the Node_A is 1 through nmos gate N1. Logic 1 at Node_A turns ON the pass gate (either nmos gate N5 or a combination- of pmos gate P47 and nmos gate N5) to pass the value of the input to output On. When only nmos gate N5 is used, Logic 1 at Node_A keeps N5 on thereby permitting the value transfer from input to output On. When a combination of pmos P47 and nmos N5 are used, Logic 1 at Node_A on one hand directly acts on nmos gate N5 and on the other hand is inverted to 0 by inverter 167 to open pmos gate P47. The inverted value of 0 from inverter 167 also ensures that nmos gate N3 remains off thereby ensuring that DISCHARGE is not activated. The MATCH line is not pulled down since ND=0 and N7 is off. This also indicates that the applied data is less than or equal to stored data.

The output On from the first range check cell (A) is applied to input In-1 of the second range check cell (B). Since the stored data in the cell is 0, the D node is 0 and ND node is 1. The second data bit 1 is applied to the cell (B) through bit line BL. Therefore NBL is 0. As a result of NBL being 0, and ND being 1, Node_A is 0 through nmos gate N12. Therefore Logic 0 that is passed through Node_A does not turn on nmos gate N11. When a combination of a pmos gate (P47 in FIG. 4) is used in parallel with nmos gate N11, Logic 0 passed through Node_A is converted by inverter (167 in FIG. 4) to 1. As a result pmos gate remains off and nmos gate N0 to the discharge is on. This ensures that the value of In-1 does not get passed on to the output of the second cell On and On' is pulled down through gate N0. This also disables the comparison of the next bit comparison. The MATCH line is also pulled down since ND=1, In-1=1 and BL=1 thereby turning on nmos gates N10, N6 and N4 respectively. The discharge of MATCH line indicates that applied data is greater than stored data and that there has been a mismatch in the intermediate applied data bit.

Figure 10:
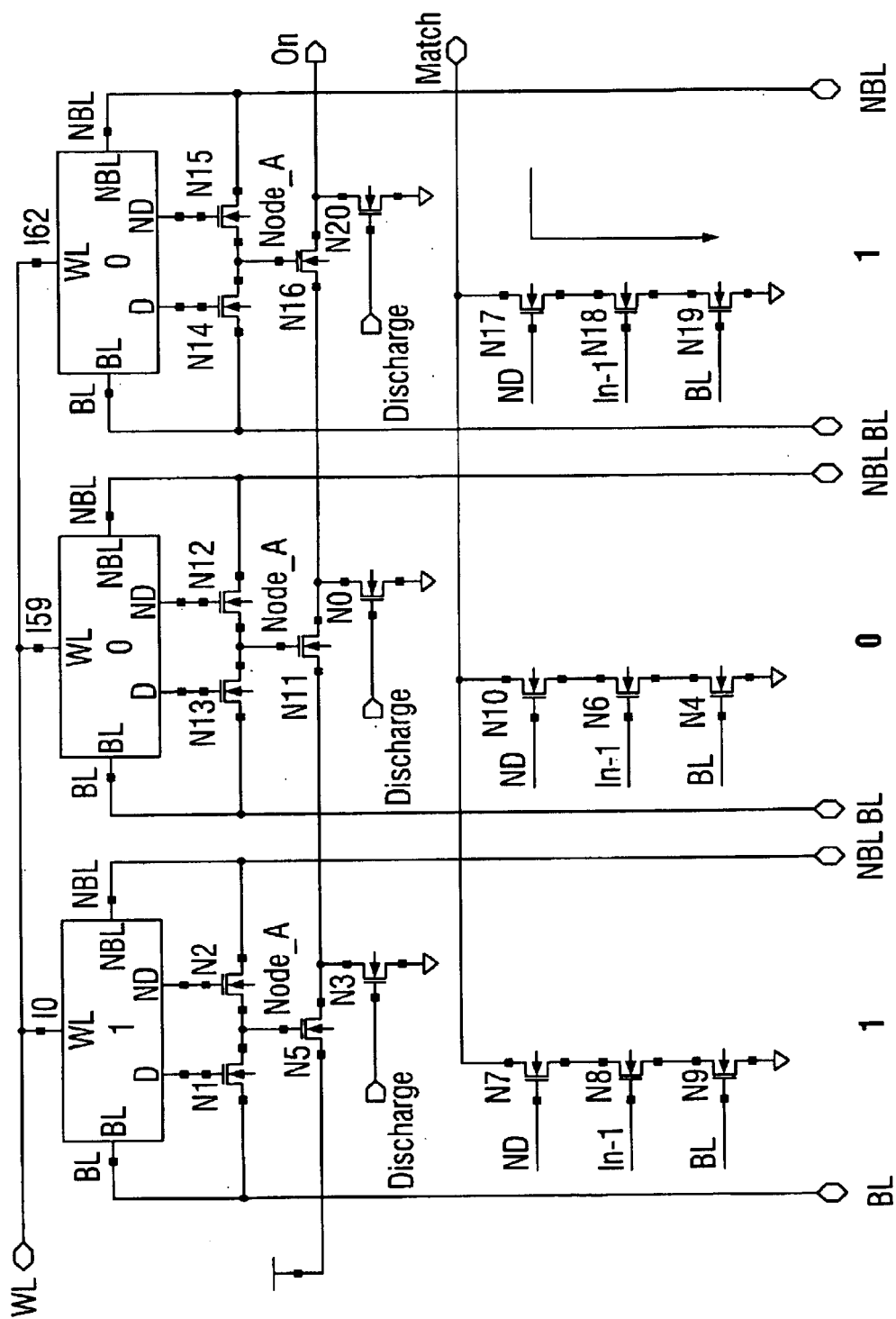
FIG. 10 is a schematic diagram of a basic range check using GTEQ showing comparison of applied data with stored data wherein there is a mismatch at the last bit.

FIG. 10 is a schematic of a basic range check using GTEQ showing a comparison of applied data with stored data wherein there is a mismatch at the last bit. In this embodiment, the stored data is 100 and the applied data is 101. Since the first bit of stored data in first cell (A) is 1 the D node is 1 and ND node is 0. Data bit to be compared 1 is applied at BL and NBL is therefore 0. As a result the Node_A is 1 through nmos gate N1. Logic 1 at Node_A turns on the pass gate (either nmos gate N5 or a combination of pmos gate P47 and nmos gate N5) to pass the value of the input to output On. When only nmos gate N5 is used, Logic 1 at Node_A keeps N5 on thereby permitting the value transfer from input to output On. When a combination of pmos P47 and nmos N5 are used, Logic 1 at Node_A on one hand directly acts on nmos gate N5 and on the other hand is inverted to 0 by inverter 167 to open pmos gate P47. The inverted value of 0 from inverter 167 also ensures that nmos gate N3 remains off thereby ensuring that DISCHARGE is not activated. The MATCH line is not pulled down since ND=0 and N7 is off. This also indicates that the applied data is less than or equal to stored data.

The output On' of the first range check cell (A) is applied to the input In-1" of the second range check cell (B). Since the stored data in the second cell is 0, the D node is 0 and ND node is 1. BL=0 and inverse NBL=1 when the applied data is 0. Since the value of NBL is 1, the value transferred to Node_A is 1 through nmos gate N12. As a result, the Logic 1 at Node_A turns on the pass gate (nmos N11 or combination of pmos gate P47 and nmos gate N11) to pass value of In-1 to On'. Inverter 167 converts the value of 1 to 0 such that the pmos gate P47 turns ON. The value of 1 from Node_A directly turns on nmos gate N11. As a result the In-1 value of 1 gets transferred to the output of the second range cell On' indicating that the applied data is equal to stored data. The value of 0 obtained from the inverter 167 is also transferred to nmos gate N0 which therefore remains shut ensuring that discharge does not occur and the On does not get pulled down. Since BL=0, nmos gate N4 remains shut thereby also ensuring that the MATCH line is not pulled down.

The output On' of cell (B) is applied to to input In-1" of cell (C). Since the stored data in cell (C) is 0, the D node is 0 and ND node is 1. The last data bit 1 is applied to the cell (B) through bit line BL. Therefore NBL is 0. As a result of NBL being 0, and ND being 1, Node_A is 0 through nmos gate N15. Therefore Logic 0 that is passed through Node_A does not turn on nmos gate N16. When a combination of a pmos gate (P47 in FIG. 4) is used in parallel with nmos gate N16, Logic 0 passed through Node_A is converted by inverter (167 in FIG. 4) to 1. As a result, pmos gate remains shut and nmos gate N20 to the discharge is on. This ensures that the value of In-1 does not get passed on to the output of the last cell On" and On" is pulled down through gate N20. This also disables the comparison of the next bit comparison. The MATCH line is also pulled down since ND=1, In-1=1 and BL=1 thereby turning on nmos gates N17, N18 and N19 respectively. The discharge of the MATCH line indicates that applied data is greater than stored data and that there has been a mismatch in the last applied data bit.

Figure 11:
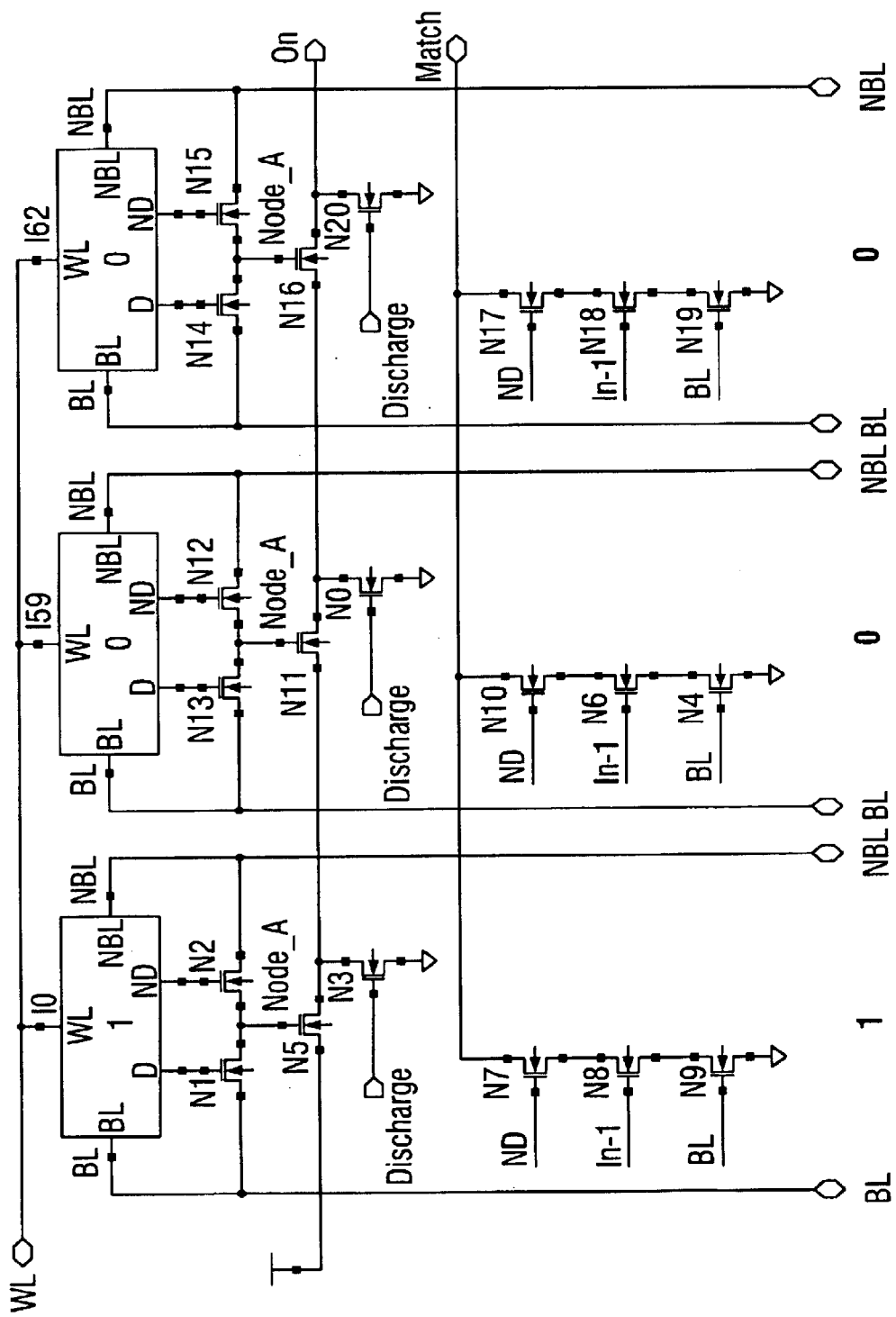
FIG. 11 is a schematic diagram of a basic range check using GTEQ showing a comparison of applied data with stored data wherein there is a match at all bits.

FIG. 11 is a schematic diagram of a basic range check using GTEQ showing a comparison of applied data with stored data wherein there is a match at all bits.

The stored data in cells (A), (B) and (C) is 100 and the applied data is 100.

Since the first bit of stored data in first cell (A) is 1, the D node is 1 and ND node is 0. Data bit to be compared 1 is applied at BL and NBL is therefore 0. As a result, the Node_A is 1 through nmos gate N1. Logic 1 at Node_A turns on the pass gate (either nmos gate N5 or a combination of pmos gate P47 and nmos gate N5) to pass the value of the input to output On. When only nmos gate N5 is used, Logic 1 at Node_A keeps N5 on thereby permitting the value transfer from input to output On. When a combination of pmos P47 and nmos N5 are used, Logic 1 at Node_A on one hand directly acts on nmos gate N5 and on the other hand is inverted to 0 by inverter 167 to open pmos gate P47. The inverted value of 0 from inverter 167 also ensures that nmos gate N3 remains off thereby ensuring that DISCHARGE is not activated. The MATCH line is not pulled down since ND=0 and N7 is off. This also indicates that the applied data is less than or equal to stored data.

The output On of the first range check cell (A) is applied to the input In-1' of the second range check cell (B). Since the stored data in the second cell is 0, the D node is 0 and ND node is 1. BL=0 and inverse NBL=1 when the applied data is 0. Since the value of NBL is 1, the value transferred to Node_A is 1 through nmos gate N12. As a result, the Logic 1 at Node_A turns ON the pass gate (nmos N11 or combination of pmos gate P47 and nmos gate N11) to pass value of In-1 to On'. Inverter 167 converts the value of 1 to 0 such that the pmos gate P47 turns ON. The value of 1 from Node_A directly turns ON nmos gate N1. As a result, the In-1 value of 1 gets transferred to the output of the second range cell On' indicating that the applied data is equal to stored data. The value of 0 obtained from the inverter 167 is also transferred to nmos gate N0 which therefore remains shut ensuring that discharge does not occur and the On does not get pulled down. Since BL=0, nmos gate N4 remains shut thereby also ensuring that the MATCH line is not pulled down.

The output On' of cell (B) is applied to input In-1" of cell (C). Since the stored data in the third cell is 0, the D node is 0 and ND node is 1. BL=0 and inverse NBL=1 when the applied data is 0. Since the value of NBL is 1, the value transferred to Node_A is 1 through nmos gate N15. As a result, the Logic 1 at Node_A turns on the pass gate (nmos N16 or combination of pmos gate P47 and nmos gate N16) to pass value of In-1 to On'. Inverter 167 converts the value of 1 to 0 such that the pmos gate P47 turns ON. The value of 1 from Node_A directly turns ON nmos gate N16. As a result, the In-1' value of 1 gets transferred to the output of the last range cell On" indicating that the applied data is equal to stored data. The value of 0 obtained from the inverter 167 is also transferred to nmos gate N20 which therefore remains shut ensuring that discharge does not occur and the On line does not get pulled down. Since BL=0, nmos gate N19 remains shut thereby also ensuring that the MATCH line is not pulled down.

In all the above figures, it must be understood that the embodiments represented are merely exemplary and further modifications in terms of increasing bit size and number of range check cells are within the contemplation thereof. The above FIGS. 4 to 11 while representing range check in terms of GTEQ work on the same principle for range check in terms of LTEQ.

Figure 12:
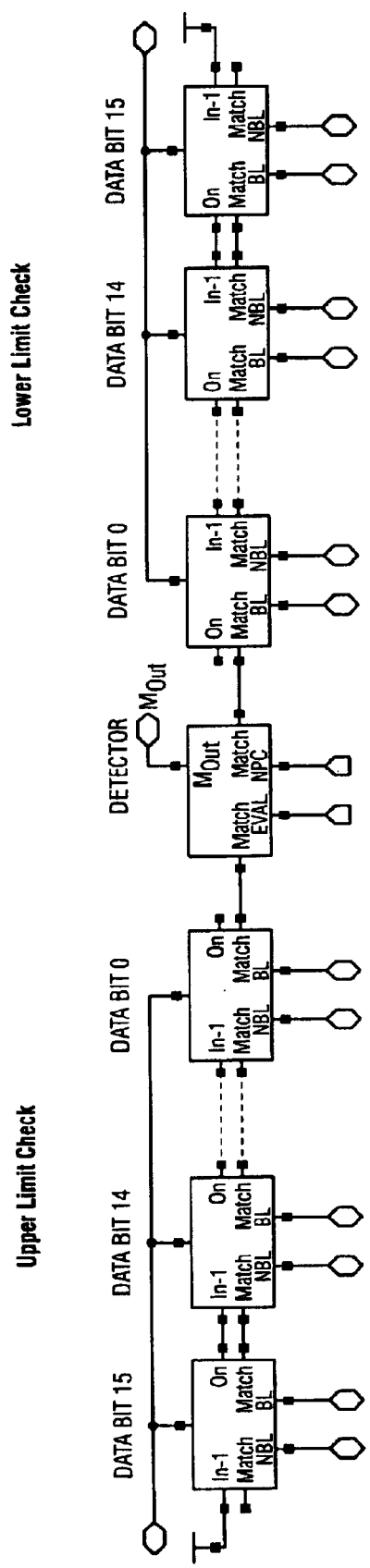
FIG. 12 is a schematic diagram of a basic range check showing both the upper limit check and the lower limit check.

FIG. 12 is a schematic of a word structure indicating the combination of GTEQ cells and LTEQ cells connected by a match detector therebetween.

Array Structure for Range Check

Figure 13:
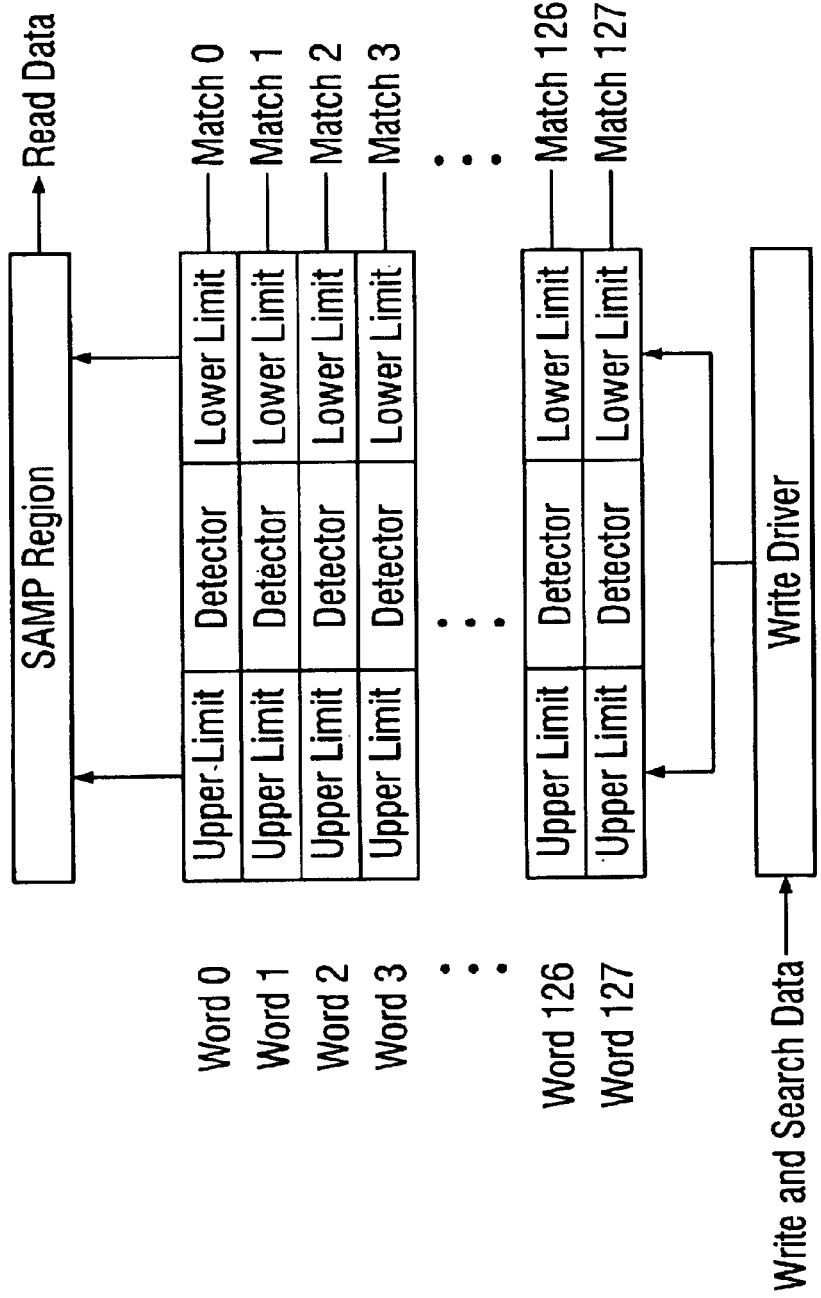
FIG. 13 is a block diagram showing the array structure for a range check.

FIG. 13 is a schematic of an array structure for range check according to the invention. Each range word has upper limit and lower limit fields and a common detector. A common write driver for both upper limit and lower limit drives the same data to both fields for range check. All 128 words get the same data for range check and one can get multiple matches depending on stored data.

Advantages of the Invention

As explained above, known solutions to the range match problem are either sequential memory based which typically expand the range field and hence require either large memory or multiple accesses to the table, or are CAM based which try to split the range search into multiple Prefix searches and use a Ternary CAM to do these searches thereby requiring multiple entries and multiple searches for each range value.

Range searches of for example, 16K entries would require Gigabytes of memory and search times of the order of microseconds. The instant invention checks for any range without requiring extra silicon area. The technique of the invention also performs exact match, prefix match and ignore function without any extra need of hardware.

Additional modifications and improvements of the present invention may also be apparent to those of ordinary skill in the art. Thus, the particular combination of parts described and illustrated herein is intended to represent only certain embodiments of the present invention, and is not intended to serve as limitations of alternative devices within the spirit and scope of the invention.

What is claimed is:

1. A range check array structure for CIDR co-processors for searching and comparing external data from external search data key with a stored data range, said range check array structure including one or more range check cells having a data storage means, said range check array configured to determine one of a greater than equal to, less than equal to and perfect match, each of said data storage means being provided with at least one of an upper limit field and a lower limit field, one or more bit lines running therethrough, for transmitting an input data word for comparison with stored data word range, said input data word being compared with respective stored data word to detect a match that is indicated along a match line, and range match detection means connected to said match line to determine the match or mismatch of the applied data stream with the stored data in each range check cell.

2. The range check array of claim 1 wherein each of said data storage means comprises one or more content addressable memory cells.

3. The range check array of claim 2 wherein said one or more content addressable memory cells are logic content addressable memory cells.

4. The range check array of claim 2 wherein in each of said data storage means, said bit line (BL/NBL), an input In-I and a node of said storage means D/ND are each connected to respective gating circuits, said respective gating circuits being connected in series to the said match line to enable pulling down of the match line for a mismatch between said applied data and respective stored data.

5. The range check array of claim 1 wherein said array is divided into two sections by said match detection means.

6. The range check array of claim 1 wherein each of said data storage means is provided with one or more gating circuits.

7. The range check array of claim 6 wherein said one or more gating circuits selectively block input data on respective said one or more bit lines, said gating circuits being controlled by a most significant bit of said input data word.

8. The range check array of claim 6 wherein when said gating circuits selectively block said bit lines said-gating circuits are controlled by a lower order bit than said most significant bit.

9. The range check array of claim 6 wherein said at least one bit of said input data word that controls said gating circuit is selected under programmable control.

10. The range check array of claim 1 wherein said range match detection means includes one or more gating circuits to AND the match outputs from the upper limit fields and respective lower limit fields to determine the final match for the input word data.

11. The range check array of claim 1 wherein the stored data is provided in a SRAM cell.

12. The range check array of claim 11 wherein the SRAM cell has a D node and an ND node which are in turn connected to a logic node Node_A through respective gating circuits.

13. The range check array of claim 12 wherein said gating circuits comprise nmos transistors and the said logic node is connected by means of another gating circuit to the input data line, said gating circuits and the logic node forming a comparator circuit to compare the applied data with the stored data and apply matching accordingly.

14. The range check array of claim 13 wherein said another gating circuit comprises of a nmos transistor.

15. The range check array of claim 13 wherein said another gating circuit comprises a nmos transistor and a pmos transistor in parallel.

16. The range check array of claim 15 wherein said gating circuit is provided with an inverter connected between the logic node Node_A and the pmos transistor to invert the logic output from said logic node.

17. The range check array of claim 1 wherein the data stored in said data storage means is written by a data writing means.

18. The range check array of claim 17 wherein said data writing means comprises a word line which is asserted to write said data, and two nodes D and inverse ND.

19. The range check array of claim 1 wherein said array is provided with a discharge circuit comprising of a discharge line connected to the output data line by means of a gating circuit.

20. The range check array of claim 19 wherein said gating circuit comprises a nmos transistor.

21. The range check array of claim 1 wherein each said bit line BL/NBL is provided with a compare bit line (CMP BL/CMP NBL) to reduce the load on said BL/NBL.

22. The range check array of claim 21 wherein said compare bit line CMP BL/CMP NBL is connected to said gating circuit in the place of the BL/NBL to enable pulling down of the match line for a mismatch between the applied data word and the stored data word.

23. The range check array of claim 1 wherein said match detection means comprises one or more gating circuits to control the transmission of data from the match line to the match out line, an external pre-charge control that is asserted in order to assert the match line, and a control signal means that is asserted to determine the match status of the range cell.

24. The range check array of claim 23 wherein the external pre-charge control is connected to the match line for control thereof by means of a gating circuit comprising of a pmos transistor.

25. The range check array of claim 24 wherein the control signal means is connected to the match line by means of a latch arrangement comprising a nmos and a pmos transistor in series.

26. The range check array of claim 1 wherein the output of each range check cell is operatively associated with the input of the consecutive range check cell.

27. The range check array of claim 1 wherein each upper limit field comprises of n range check cells.

28. The range check array of claim 1 wherein each lower limit field comprises of n range check cells.

29. The range check array of claim 1 wherein said range check cell is provided with another output line connected to a logic node through a gating circuit to ensure a perfect match.

30. A range cam word for use in a range check array, said range cam word comprising at least one upper limit field to store the upper limit(s) of the range entry, at least one lower limit field to store the lower limit(s) of the range entry, said at least one upper limit field and at least one lower limit field being both connected to at least one match detection means in order to match output data from the respective upper limit field and respective lower limit field to obtain the final match output.

31. The range cam word of claim 30 wherein said array is divided into two sections by said match detection means.

32. The range cam word of claim 30 wherein said array includes one or more range check cells having data storage means provided with one or more gating circuits.

33. The range cam word of claim 32 wherein said one or more gating circuits selectively block input data on respective said one or more bit lines, said gating circuits being controlled by a most significant bit of said input data word.

34. The range cam word of claim 32 wherein when said gating circuits selectively block said bit lines, said gating circuits are controlled by a lower order bit than said most significant bit.

35. The range cam word of claim 32 wherein said at least one bit of said input data word that controls said gating circuit is selected under programmable control.

36. The range cam word of claim 30 wherein the match detector is provided with one or more gating circuits to AND the match outputs from the upper limit fields and respective lower limit fields to determine the final match for the input word data.

37. The range cam word of claim 30 wherein the stored data is provided in a SRAM cell.

38. The range cam word of claim 37 wherein the SRAM cell has a D node and a ND node which are in turn connected to a logic node Node-A through respective gating circuits.

39. The range cam word of claim 38 wherein said gating circuits comprise nmos transistors and the said logic node is connected by means of another gating circuit to the input data line, said gating circuits and the logic node forming a comparator circuit to compare the applied data with the stored data and apply matching accordingly.

40. The range cam word of claim 39 wherein said another gating circuit comprises a nmos transistor.

41. The range cam word of claim 39 wherein said another gating circuit comprises a nmos transistor and a pmos transistor in parallel.

42. The range cam word of claim 41 wherein said gating circuit is provided with an inverter connected between the logic node Node-A and the pmos transistor to invert the logic output from said logic node.

43. The range cam word of claim 30 wherein the data stored in said data storage means is written by a data writing means.

44. The range cam word of claim 43 wherein said data writing means comprises a word line which is asserted to write said data, and two nodes D and inverse ND.

45. The range cam word of claim 30 wherein said array is provided with a discharge circuit comprising of a discharge line connected to the output data line by means of a gating circuit.

46. The range cam word of claim 45 wherein said gating circuit comprises a nmos transistor.

47. The range cam word of claim 30 wherein each of said range check cells comprises a bit line (BL/NBL), an input In-1 and a node of said storage means DIND that are each connected to respective gating circuits, said respective gating circuits being connected-in series to the said match line to enable pulling down of the match line for a mismatch between said applied data and respective stored data.

48. The range cam word of claim 30 wherein said match line is connected to said match detector.

49. The range cam word of claim 30 wherein each said bit line BL/NBL is provided with a compare bit line (CMP BL/CMP NBL) to reduce the load on said BL/NBL.

50. The range cam word of claim 49 wherein said compare bit line CMP BL/CMP NBL is connected to said gating circuit in the place of the BL/NBL to enable pulling down of the match line for a mismatch between the applied data word and the stored data word.

51. The range cam word of claim 30 wherein the output of each range check cell is operatively associated with the input of the consecutive range check cell.

52. The range cam word of claim 30 wherein each upper limit field comprises of n range check cells.

53. The range cam word of claim 30 wherein each lower limit field comprises of n range check cells.

54. The range cam word of claim 30 wherein said range check cell is provided with another output line connected to a logic node through a gating circuit to ensure a perfect match.

55. A range check cell for use in a range check array comprising a data storage means for storing a data bit, data input bit lines for inputting the data entry to be checked, one or more control and comparator means being provided to check and compare respectively the input data entry with the stored data in order to provide a match, an output data node On which enables transfer of data to an input node In-I of the consecutive range cell, and a discharge circuit to discharge the match line in the event of a mismatch.

56. The range check cell of claim 55 wherein said data storage means comprises a SRAM and logic.

57. The range check cell of claim 55 wherein the comparator means comprises nmos transistors N1 and N2 connected at one end thereof at nodes D and ND of the SRAM cell respectively and controlled thereby, the other ends of said transistors being connected to logic node Node-A in order to enable transfer of appropriate logic information thereto, said logic node being in turn connected to another gating circuit controlling transfer of input from In-1 to On.

58. The range check cell of claim 57 wherein said another gating circuit comprises a nmos transistor or a combination of a nmos transistor and pmos transistor in parallel with an inverter connected there between.

59. The range check cell of claim 57 wherein said match line is connected to a latch circuit to enable pulling down of the match line in the event of a mismatch.

60. The range check cell of claim 59 wherein said latch circuit comprises a plurality of nmos transistors connected to the match line.

61. The range check cell of claim 60 wherein the nmos transistors are connected at the other ends thereof to a node DIND of the data storage means, bit lines BL/NBL, and the input node In-1 of the range check cell and are respectively controlled thereby.

62. The range check cell of claim 61 wherein said nmos transistors are connected to node ND, input node In-I and to bit line BL for a greater than or equality check.

63. The range check cell of claim 61 wherein the said nmos transistors are connected to node D, input node In-1 and to bit line NBL for a less than or equality check.

64. In a database including a plurality of range word arrays used for searching operations in a CIDR protocol in a network environment having routers for routing received packets of information to different destinations and router tables storing information for use in said search operations, the stored information being in the form of a plurality of word arrays, which in turn store a plurality of word ranges, a method for searching an entry from the applied data within a range of the stored data using an external search data key which comprising:

a) comparing the external search data bit with all stored word ranges in the respective upper limit field or lower limit field;

b) detecting the match output through a match detection means;

c) ANDing the match output from both the upper limit field and the lower limit field to obtain a match output data; and d) outputting the data so read to determine the match.

65. A method as claimed in claim 64 wherein the input data and the stored data are encoded in binary form.

66. A method as claimed in claim 64 wherein when match output is obtained by comparing a greater than equal to match, a perfect match, and a lower than equal to match between the applied data bit and the stored data bit.

67. A method as claimed in claim 66 wherein in the greater than equal to match, the match level is high and the match holds true when the input data is less than or equal to the stored data.

68. A method as claimed in claim 66 wherein in the less than equal to match the match output is high and the comparison holds true when the stored lower limit of the range entry is less than or equal to the input data bit.

69. A method as claimed in claim 64 wherein the range is checked by checking stored bits from the most significant bit to the least significant bit of the applied input data.

* * * * *